(12) United States Patent
Phan et al.

(10) Patent No.: US 11,297,713 B2
(45) Date of Patent: Apr. 5, 2022

(54) REFERENCE METAL LAYER FOR SETTING THE IMPEDANCE OF METAL CONTACTS OF A CONNECTOR

(71) Applicant: SUPER MICRO COMPUTER, INC., San Jose, CA (US)

(72) Inventors: Manhtien V. Phan, Morgan Hill, CA (US); Mau-Lin Chou, Milpitas, CA (US); Chih-Hao Lee, NewTaipei (TW)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 16/953,673

(22) Filed: Nov. 20, 2020

(65) Prior Publication Data

US 2021/0235577 A1    Jul. 29, 2021

Related U.S. Application Data

(63) Continuation-in-part of application No. 17/070,167, filed on Oct. 14, 2020, now Pat. No. 11,166,367, which is a continuation of application No. 16/750,686, filed on Jan. 23, 2020, now Pat. No. 10,849,220.

(51) Int. Cl.
| | |
|---|---|
| *H05K 1/02* | (2006.01) |
| *H05K 1/11* | (2006.01) |
| *H05K 1/16* | (2006.01) |
| *H01R 13/66* | (2006.01) |
| *H01R 13/629* | (2006.01) |
| *H01R 13/646* | (2011.01) |
| *H01R 13/6469* | (2011.01) |
| *H01R 13/6471* | (2011.01) |
| *H01R 13/6473* | (2011.01) |
| *H01R 43/20* | (2006.01) |

(52) U.S. Cl.
CPC ......... *H05K 1/0253* (2013.01); *H05K 1/0298* (2013.01); *H05K 2201/093* (2013.01)

(58) Field of Classification Search
CPC ... H05K 1/02; H05K 1/11; H05K 1/16; H05K 1/115; H05K 1/181; H01R 13/66; H01R 13/629; H01R 13/646; H01R 13/6469; H01R 13/6471; H01R 13/6473; H01R 43/20; H01R 43/205
USPC ............. 174/261, 260; 439/497, 620.22, 660
See application file for complete search history.

(56) References Cited

U.S. PATENT DOCUMENTS

| | | | | |
|---|---|---|---|---|
| 2008/0029763 | A1* | 2/2008 | Kasukabe | ........ G01R 31/31905 257/48 |
| 2011/0100694 | A1* | 5/2011 | Regnier | ................. H05K 1/181 174/260 |
| 2011/0177721 | A1* | 7/2011 | Yotsutani | ............. H01R 13/112 439/660 |
| 2015/0349465 | A1* | 12/2015 | Cornelius | ............ H01R 13/665 439/620.22 |
| 2015/0364846 | A1* | 12/2015 | Chen | .................... H01R 12/775 439/497 |

(Continued)

*Primary Examiner* — Xiaoliang Chen
(74) *Attorney, Agent, or Firm* — Patrick D. Benedicto

(57) ABSTRACT

A circuit board has an electrical circuit and a connector that is attached to the circuit board. The connector has metal contacts. A housing of the connector has an embedded reference metal layer that is disposed under a single-ended metal contact or differential metal contacts. The reference metal layer sets the impedance of the single-ended metal contact or the differential metal contacts.

5 Claims, 35 Drawing Sheets

(56) References Cited

U.S. PATENT DOCUMENTS

| | | | |
|---|---|---|---|
| 2018/0048094 A1* | 2/2018 | Cornelius | H01R 13/6473 |
| 2019/0200449 A1* | 6/2019 | Toda | H05K 1/0245 |
| 2020/0045808 A1* | 2/2020 | Kagaya | H01P 5/028 |
| 2020/0083645 A1* | 3/2020 | Lee | H01R 13/6587 |
| 2020/0176905 A1* | 6/2020 | Buck | H01R 13/514 |

* cited by examiner

REFERENCE METAL LAYER FOR SETTING THE IMPEDANCE OF METAL CONTACTS OF A CONNECTOR

CROSS-REFERENCE TO RELATED APPLICATIONS

The present application is a continuation-in-part of U.S. application Ser. No. 17/070,167, filed on Oct. 14, 2020, now U.S. Pat. No. 11,166,367, which is a continuation of U.S. application Ser. No. 16/750,686, filed on Jan. 23, 2020, now U.S. Pat. No. 10,849,220 both of which are incorporated herein by reference in their entirety.

BACKGROUND OF THE INVENTION

1. Field of the Invention

The present invention relates generally to connectors that may be attached to circuit boards.

2. Description of the Background Art

Components of electrical circuits may be mounted on a circuit board, such as a printed circuit board (PCB). Generally speaking, a PCB has a substrate comprising metal and dielectric layers. The metal layers include signal traces that electrically connect two or more points on the PCB and a reference plane that provides a reference, such as a ground reference.

FIG. 1 is a cross-sectional view of a conventional PCB 104. The PCB 104 includes a plurality of signal traces 101, a dielectric layer 103, and a reference plane 102. The signal traces 101 and the reference plane 102 comprise a metal. The signal traces 101 are on one surface of the dielectric layer 103, and the reference plane 102 is on the opposing surface of the dielectric layer 103. The distance between the signal traces 101 and the reference plane 102 is set by the thickness H of the dielectric layer 103.

A differential impedance is the impedance presented by two signal traces 101 to a differential signal propagating on the two signal traces 101. Traditionally, the differential impedance is set by adjusting the width W of the signal traces 101, the thickness T of the signal traces 101, the separation distance S between the signal traces 101, and/or the thickness H of the dielectric layer 103. Embodiments of the present invention allow for setting of differential or single-ended impedance when parameters for setting the impedance are constrained.

SUMMARY

In one embodiment, an impedance of one or more signal traces of a circuit board is set by forming a first signal trace on a first surface of a dielectric layer of the circuit board. A reference plane is formed on a second surface of the dielectric layer. A reference trace is formed within the dielectric layer. The impedance of the first signal trace or differential impedance of the first signal trace and a second signal trace may be set by adjusting one or more parameters of the reference trace.

In another embodiment, a circuit board comprises a dielectric layer; a first signal trace and a second signal trace formed on a first surface of the dielectric layer on an edge connector of the circuit board; a reference plane formed on a second surface of the dielectric layer; and a reference trace formed within the dielectric layer and between the reference plane and the first and second signal traces, the reference trace being configured to set a target differential impedance of the first and second signal traces.

In yet another embodiment, an impedance of one or more signal traces of a circuit board is set by forming a first signal trace on a first surface of a dielectric layer of the circuit board. A reference trace is formed on a second surface of the dielectric layer. The impedance of the first signal trace or differential impedance of the first signal trace and a second signal trace may be set by adjusting one or more parameters of the reference trace.

In yet another embodiment, a circuit board has an electrical circuit and a connector that is attached to a substrate of the circuit board. The connector has metal contacts, where two adjacent metal contacts are configured to carry a differential signal. A housing of the connector has an embedded reference metal layer that is disposed under and between the differential metal contacts. The width of the reference metal layer may be adjusted to set the differential impedance of the differential metal contacts.

In yet another embodiment, a circuit board has an electrical circuit and a connector that is attached to a substrate of the circuit board. The connector has metal contacts, where a metal contact is configured to carry a single-ended signal. The single-ended metal contact is adjacent to another metal contact. A housing of the connector has an embedded reference metal layer that is disposed under the single-ended metal contact. The reference metal layer is connected to a ground reference when the adjacent metal contact is not connected to ground. In that case, the width of the reference metal layer may be adjusted to set the impedance of the single-ended metal contact. The reference metal layer may or may not be connected to a ground reference when the adjacent metal contact is connected to ground. When the adjacent metal contact is grounded, the width and/or location of the single-ended metal contact may be adjusted to set the impedance of the single-ended metal contact.

These and other features of the present invention will be readily apparent to persons of ordinary skill in the art upon reading the entirety of this disclosure, which includes the accompanying drawings and claims.

The use of the same reference label in different drawings indicates the same or like components. The figures are not drawn to scale.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
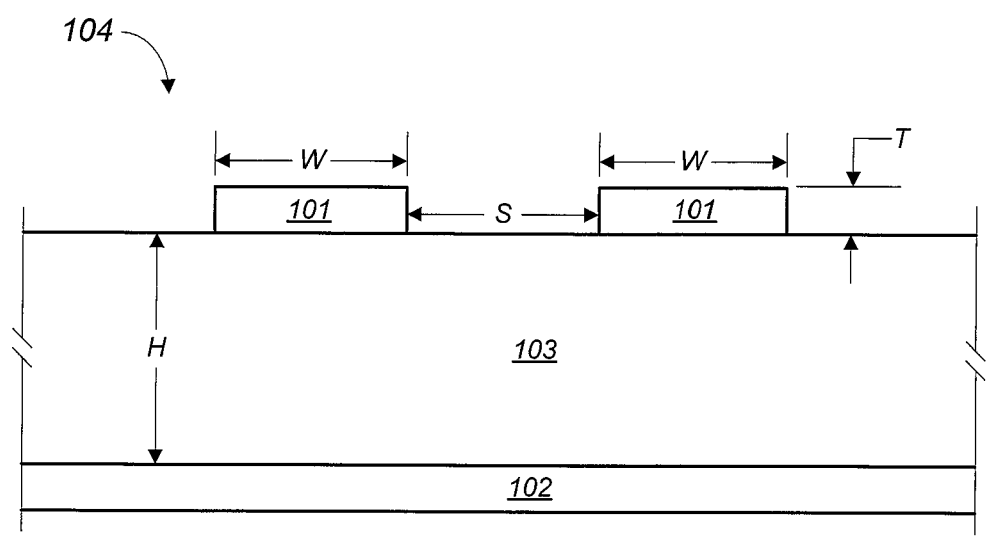
FIG. 1 is a cross-sectional view of a conventional PCB.
Figure 2:
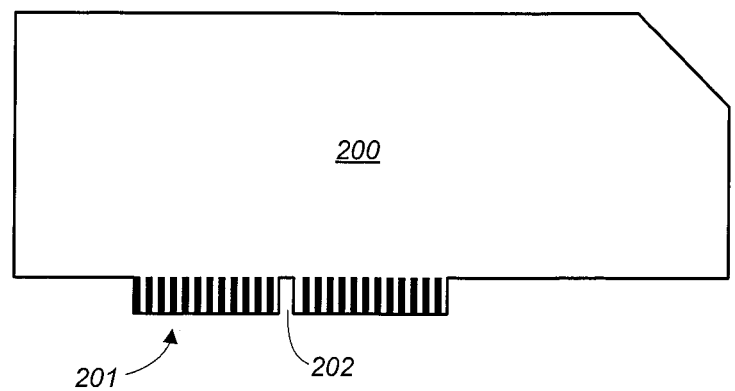
FIG. 2 is a side view of a PCB in accordance with an embodiment of the present invention.

FIG. 2 is a side view of a PCB 200 in accordance with an embodiment of the present invention. The PCB 200 includes a connector 201, which protrudes from a bottom edge of the PCB 200. As its name indicates, the connector 201 allows the PCB 200 to be removably connected to another circuit board, such as a motherboard or a backplane. In the example of FIG. 2, the connector 201 is an edge connector that is removably inserted into a slot (not shown) of the other circuit board. The connector 201 comprises a plurality of signal traces 203 (shown in FIG. 3), which in the example of FIG. 2 are contact fingers that contact corresponding pins of the slot. The connector 201 may include one or more notches 202. A notch 202 prevents incorrect insertion of the connector 201 into the slot.

Figure 3:
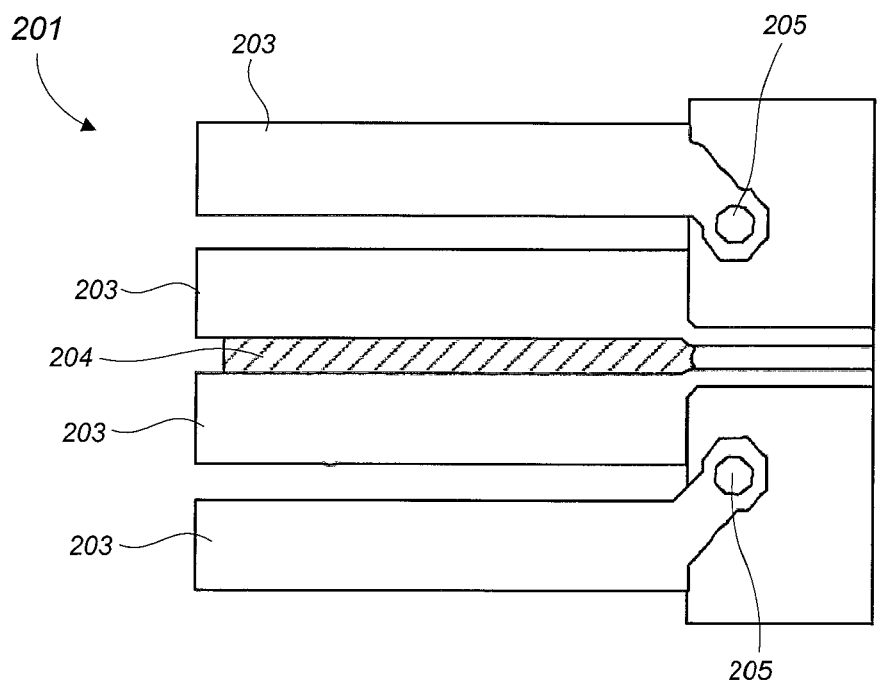
FIG. 3 is a zoom-in view of a connector of the PCB of FIG. 2 in accordance with an embodiment of the present invention.

FIG. 3 is a zoom-in view of the connector 201 in accordance with an embodiment of the present invention. In the example of FIG. 3, a reference trace 204 is formed directly below adjacent signal traces 203, which are referred to herein as "differential signal traces" in that they are configured to carry a differential signal.

The reference trace 204 is visible in FIG. 3 for illustration purposes only. In practice, the reference trace 204 is not readily visible because the reference trace 204 is within a dielectric layer 211 (shown in FIG. 4) of the PCB 200. The signal traces 203 interconnect points on the PCB 200 and electrical components, such as integrated circuits, resistors, capacitors, etc., mounted on the PCB 200. The PCB 200 may include one or more vias 205 to allow the signal traces 203 to be routed to other layers of the PCB 200. The signal traces 203 are contact fingers at least in the connector 201 portion of the PCB 200.

Figure 4:
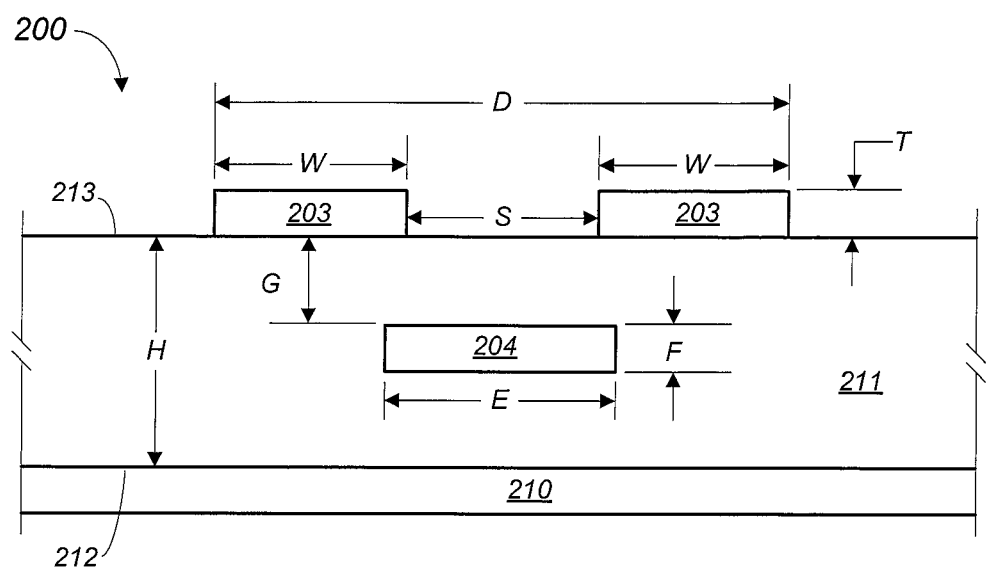
FIG. 4 is a cross-sectional view of the PCB of FIG. 2 in accordance with an embodiment of the present invention.

FIG. 4 is a cross-sectional view of the PCB 200 in accordance with an embodiment of the present invention. In the example of FIG. 4, the PCB 200 comprises a dielectric layer 211 having a surface 213 and an opposing surface 212. The signal traces 203 are formed on the surface 213 and a reference plane 210 is formed on the surface 212. The dielectric layer 211 has a thickness H, which in the example of FIG. 4 is the distance between the signal traces 203 and the reference plane 210. The signal traces 203 and the reference plane 210 comprise a metal. For example, the signal traces 203 and the reference plane 210 may each comprise gold or copper. The PCB 200 may have additional layers depending on the application. For example, the reference plane 210 may be between the dielectric layer 211 and another dielectric layer (not shown).

In one embodiment, the signal traces 203 are contact fingers of a connector that must meet specifications of a standard, such as the Peripheral Component Interconnect (PCI) Express bus standard. Some standards may specify a differential impedance, i.e., the impedance presented by two signal traces to a differential signal propagating on the two signal traces. For example, the PCI Express bus standard requires a target differential impedance of 85 Ohms. A target differential impedance required by a standard may be difficult to meet when the width W of the signal traces 203, the thickness T of the signal traces 203, and/or the thickness H of the dielectric layer 211 cannot be adjusted or has limited adjustability because of electrical or mechanical constraints.

In the example of FIG. 4, the PCB 200 includes a reference trace 204. As is well-known, a "trace" makes an electrical connection between two or more points on a PCB, whereas a "plane" is an uninterrupted area of metal that covers a layer of PCB. Without any electrical component mounted on the PCB 200 and in terms of direct current (DC), the reference trace 204, each signal trace 203, and the reference plane 210 are isolated from each other, i.e., the resistance between them is very high. The differential impedance of differential signal traces 203 may be measured using a time domain reflectometer (TDR).

The reference trace 204 may comprise a metal, such as copper. In one embodiment, the reference trace 204 is formed within the dielectric layer 211, directly under and between two adjacent signal traces 203 that are configured as differential signal traces. The reference trace 204 may have a width E that is narrower than a spanning distance D between outer side perimeters of the differential signal traces 203. The reference trace 204 has a thickness F and is separated from the signal traces 203 by a depth G. The width E, thickness F, depth G, position of the reference trace 204 within the dielectric 211, and/or other parameters of the reference trace 204 may be adjusted to meet a target differential impedance of the signal traces 203. More particularly, given constant/fixed or limited adjustability of the parameters of the signal traces 203, dielectric layer 211, and reference plane 210, the differential impedance of the differential signal traces 203 may be set to meet a target impedance by adjusting one or more parameters of the reference trace 204. The parameters of the reference trace 204 may be set to meet a target impedance by using suitable electromagnetic field simulation software, such as the ANSYS HFSS software, for example.

Figure 5:
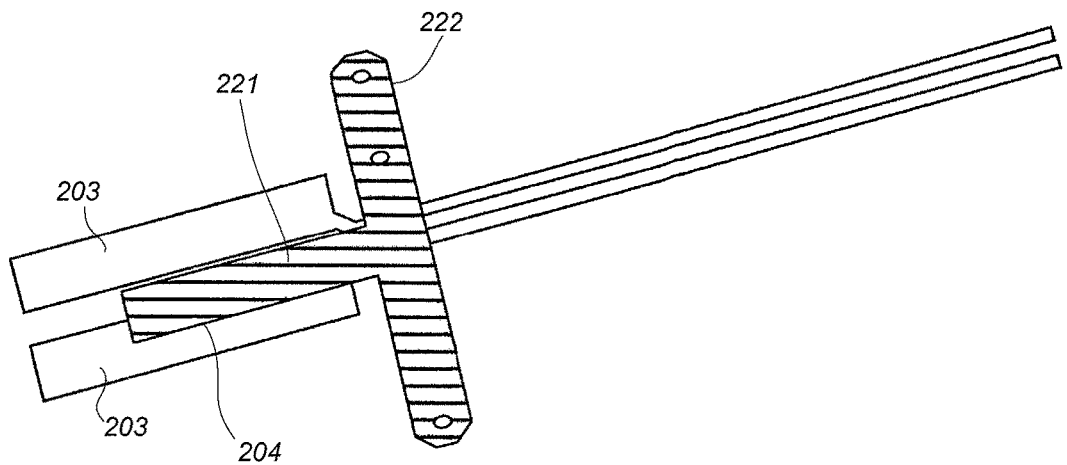
FIGS. 5 and 6 are three-dimensional views that illustrate the orientation of signal traces relative to a reference trace of the PCB of FIG. 2 in accordance with an embodiment of the present invention.
Figure 6:
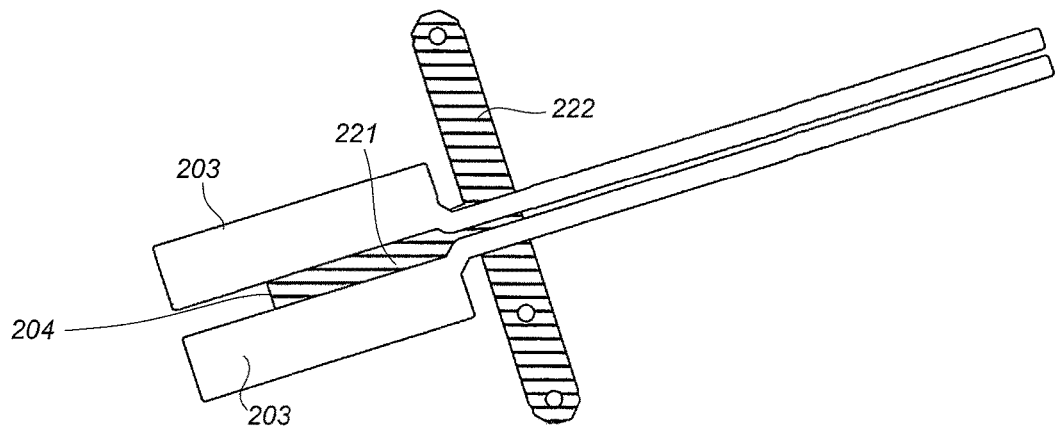

FIGS. 5 and 6 are three-dimensional (3D) views that illustrate the orientation of the differential signal traces 203 relative to the reference trace 204 in accordance with an embodiment of the present invention. FIGS. 5 and 6, which do not show the dielectric layer 211, may be a 3D view of the connector 201 shown in FIG. 3. FIG. 5 is a view from underneath the reference trace 204. As shown in FIG. 5, the reference trace 204 may have a longitudinal portion 221 that is in parallel with the length of at least the contact finger portions of the differential signal traces 203. In the example of FIG. 5, the reference trace 204 has a T-shape, with a portion 222 that is perpendicular to the longitudinal portion 221. FIG. 6 is a view from a top of the signal traces 203.

The inventors performed several case studies that compare the effectiveness of the reference trace 204 compared to other ways of setting the differential impedance of differential signal traces 203 (i.e., two adjacent signal traces 203 that are configured to propagate a differential signal) to meet a target impedance, which is 85 Ohms in the case studies. In the case studies, the dielectric layer 211 has a total thickness of 63.5 mils and a dielectric constant of 3.0, and each of the differential signal traces 203 has pad size (i.e., size of the contact finger portion) of 28×166 mils as per the PCI Express bus standard. The case studies were performed using the ANSYS HFSS software. These case studies are now explained with reference to FIGS. 7-11.

Figure 7:
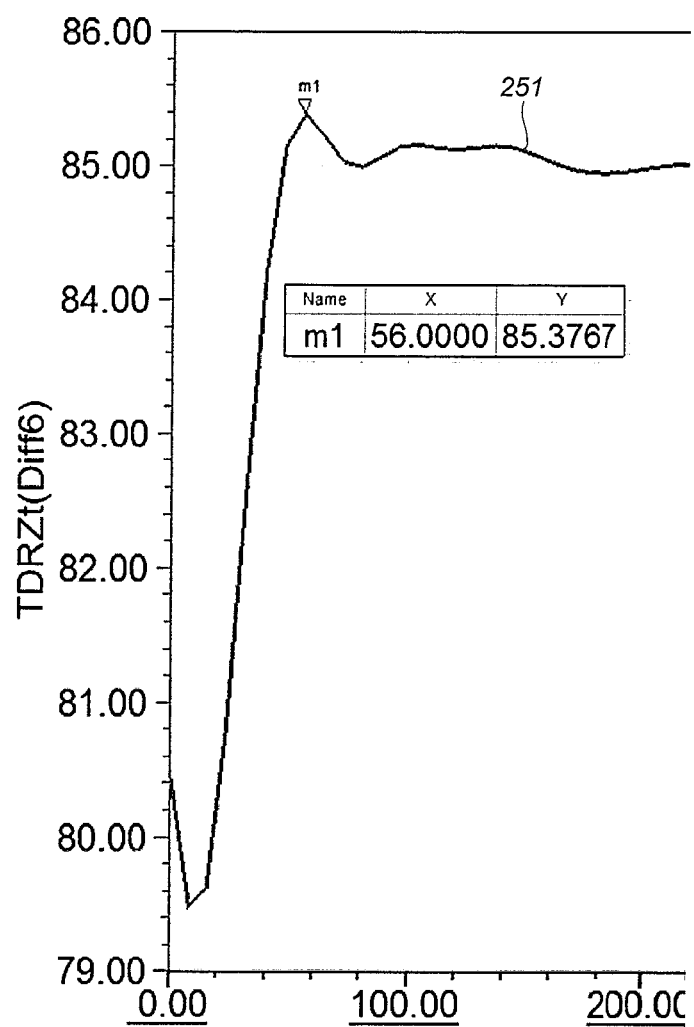
FIG. 7 is a graph of differential impedance in a first case study performed by the inventors.

FIG. 7 is a graph 251 of differential impedance in a first case study performed by the inventors. The graph 251 indicates the differential impedance of differential signal traces 203 employed as contact fingers and with a reference trace 204 as shown in FIG. 3. For the case study of FIG. 7, the reference trace 204 has a depth G (see FIG. 4) of 12.2 mils and a width E of 25 mils. In the example of FIG. 7, the vertical axis indicates differential impedance in Ohms and the horizontal axis indicates time in picoseconds. As shown in FIG. 7, the reference trace 204 allows for a differential impedance of about 85 Ohms, which is the target impedance in this example. The width E of the reference trace 204 may be adjusted to tune the differential impedance of the signal traces 203.

Figure 8:
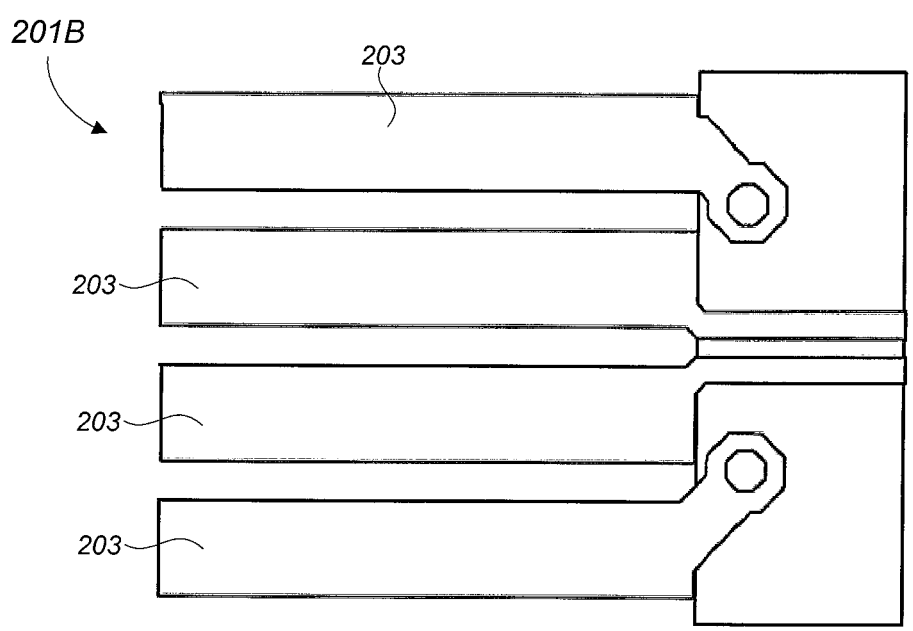
FIG. 8 is a zoom-in view of a connector in a second case study performed by the inventors.

FIG. 8 is a zoom-in view of a connector 201B in a second case study performed by the inventors. The connector 201B is a particular embodiment of the connector 201 of FIG. 3, but without a reference plane 210 and without a reference trace 204. In the second case study, the differential impedance of the differential signal traces 203 is constrained by the thickness H of the dielectric layer 211 and the pad size of the signal traces 203.

Figure 9:
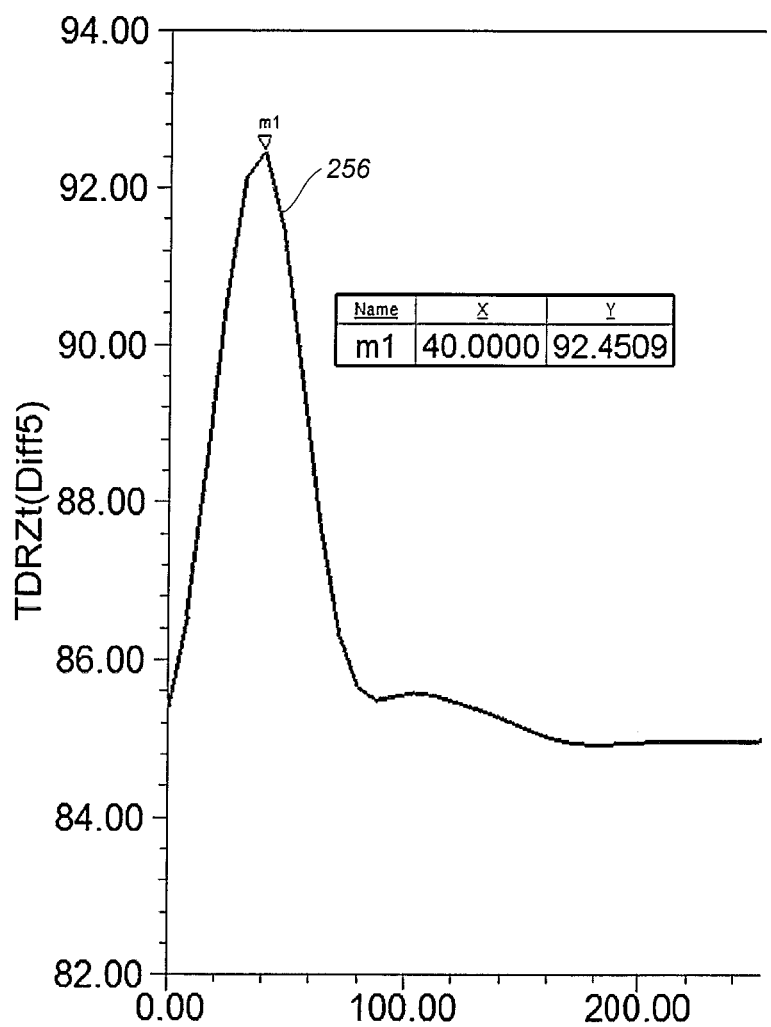
FIG. 9 is a graph of differential impedance in the second case study performed by the inventors.

FIG. 9 is a graph 256 of differential impedance in the second case study. The graph 256 indicates the differential impedance of differential signal traces 203 employed as contact fingers in the connector 201B of FIG. 8. In the example of FIG. 9, the vertical axis indicates differential impedance in Ohms and the horizontal axis indicates time in picoseconds. As shown in FIG. 9, removing the reference plane 210 and the reference trace 204 yields a differential impedance of about 92 Ohms, which is higher than the target impedance of 85 Ohms.

Figure 10:
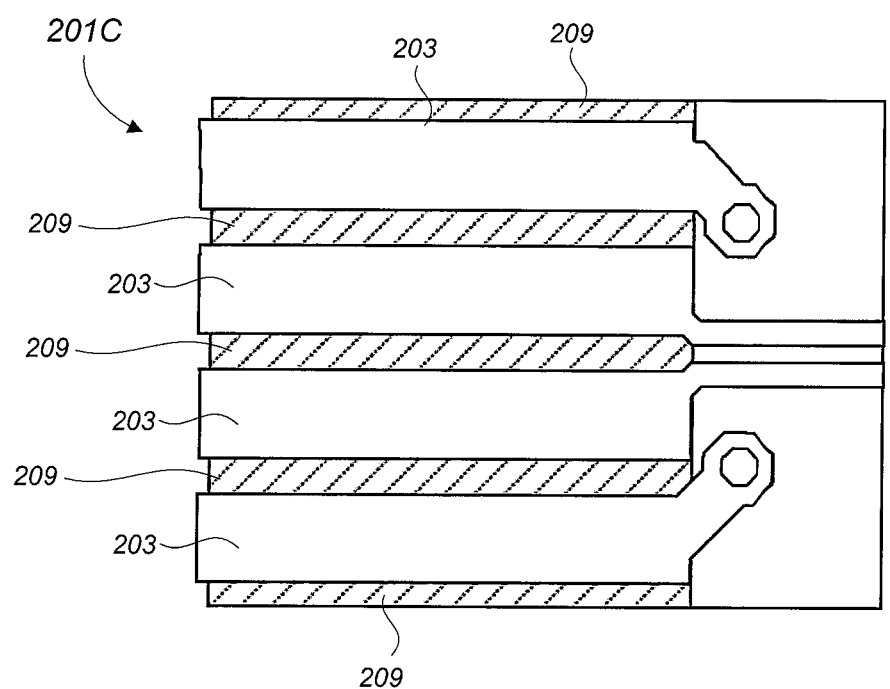
FIG. 10 is a zoom-in view of a connector in a third case study performed by the inventors.

FIG. 10 is a zoom-in view of a connector 201C in a third case study performed by the inventors. The connector 201C is particular embodiment of the connector 201 of FIG. 3, but with the reference trace 204 replaced with a reference plane 209 underneath all of the signal traces 203 of the connector 201. That is, the connector 201C has a reference plane 210 (as in FIG. 4) and a reference plane 209 instead of the reference trace 204. The reference plane 209 is set in the dielectric layer 211 at a depth G of 29.14 mils from the signal traces 203. In the third case study, the differential impedance of differential signal traces 203 is constrained by the limited depth G of the reference plane 209 and the fixed pad size of the signal traces 203.

Figure 11:
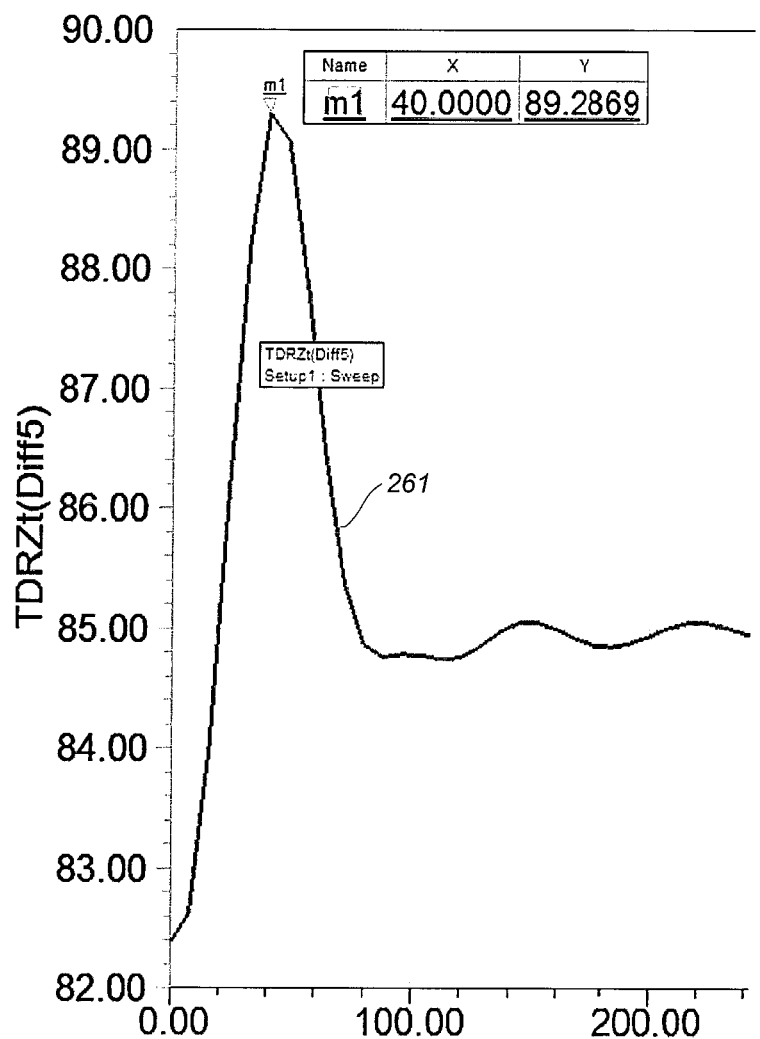
FIG. 11 is a graph of differential impedance in the third case study performed by the inventors.

FIG. 11 is a graph 261 of differential impedance in the third case study. The graph 261 indicates the differential impedance of differential signal traces 203 employed as contact fingers as in the connector 201C of FIG. 10. In the example of FIG. 11, the vertical axis indicates differential impedance in Ohms and the horizontal axis indicates time in picoseconds. As shown in FIG. 11, replacing the reference trace 204 with the reference plane 209 results in a differential impedance of about 89 Ohms, which is higher than the target impedance of 85 Ohms.

Figure 12:
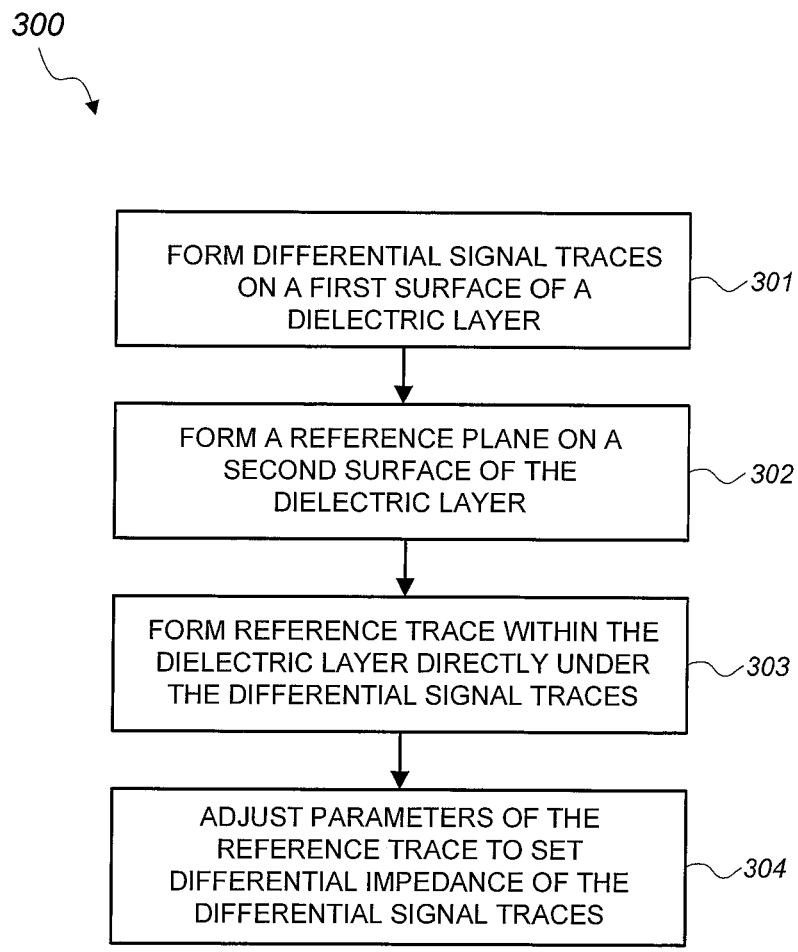
FIG. 12 is a flow diagram of a method of setting a differential impedance of differential signal traces in accordance with an embodiment of the present invention.

FIG. 12 is a flow diagram of a method 300 of setting a differential impedance of differential signal traces in accordance with an embodiment of the present invention. In the example of FIG. 12, the differential signal traces are adjacent signal traces that are formed on a first surface of a dielectric layer (step 301). The dielectric layer may be that of a PCB and the differential signal traces may be contact fingers on an edge connector of the PCB. A reference plane is formed on a second, opposing surface of the dielectric layer (step 302). A reference trace is formed within the dielectric layer (step 303), between the differential signal traces and the reference plane. Each of the reference trace, reference plane, and differential signal traces comprises a metal. The reference trace is positioned between the differential signal traces and may have dimensions that are constrained within outer perimeters of the signal traces.

One or more parameters of the reference trace are adjusted to set the differential impedance of the differential signal traces (step 304). The parameters of the reference trace include the thickness of the reference trace, the width of the reference trace, the distance of the reference trace relative to the differential signal traces, and the position of the reference trace within the dielectric layer. For example, parameters of the differential signal traces, the reference plane, and the dielectric layer may be fixed or have limited adjustability because of electrical or mechanical constraints imposed by a standard. In that example, one or more parameters of the reference trace are adjusted to set the differential impedance of the differential signal traces to meet a target impedance required by the standard, while holding the parameters of the dielectric layer, differential signal traces, and reference plane constant.

Figure 13:
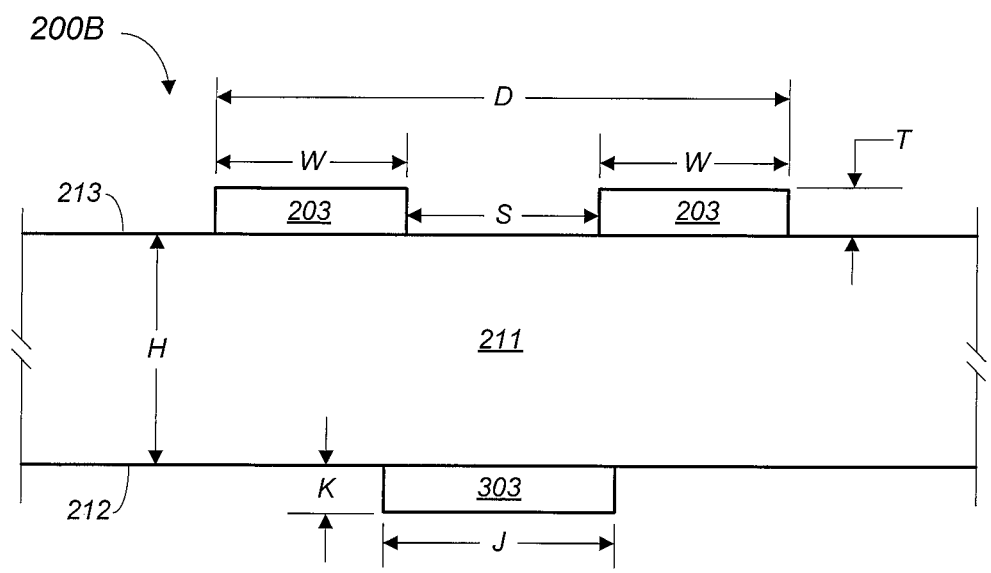
FIG. 13 is a cross-sectional view of a PCB in accordance with an embodiment of the present invention.

FIG. 13 is a cross-sectional view of a PCB 200B in accordance with an embodiment of the present invention. The PCB 200B is a particular embodiment of the PCB 200 shown in FIG. 4. The PCB 200B is the same as the PCB 200 but without a reference trace 204 within the dielectric layer 211 and without a reference plane 210 on the opposing surface 212 of the dielectric layer 211. Instead, the PCB 200B has a reference trace 303 that is formed on the surface 212 of the dielectric layer 211.

More particularly, the PCB 200B comprises the dielectric layer 211 and signal traces 203 as previously described. A reference trace 303, instead of a reference plane, is formed on the surface 212 of the dielectric layer 211. In the example of FIG. 13, the reference trace 303 is between the signal traces 203, has a thickness K, and has a width J that is narrower than the spanning distance D between outer side perimeters of the adjacent signal traces 203. The thickness K, width J, and the position of the reference trace 303 on the surface 212 may be adjusted to set the differential impedance of the signal traces 203.

Figure 14:
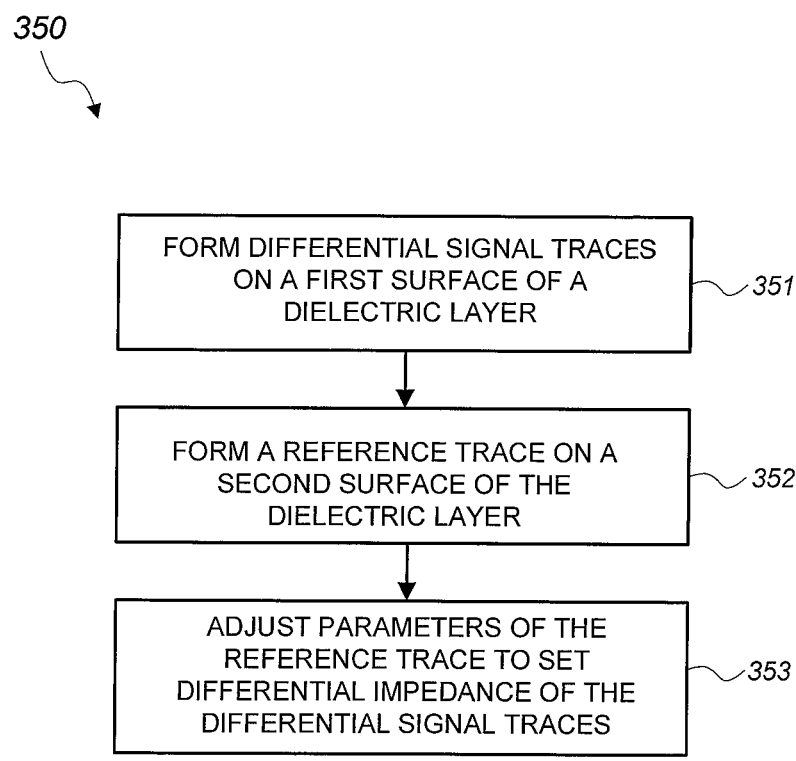
FIG. 14 is a flow diagram of a method of setting a differential impedance of differential signal traces in accordance with an embodiment of the present invention.

FIG. 14 is a flow diagram of a method 350 of setting a differential impedance of differential signal traces in accordance with an embodiment of the present invention. In the example of FIG. 14, the differential signal traces are adjacent signal traces that are formed on a first surface of a dielectric layer (step 351). The dielectric layer may be that of a PCB and the differential signal traces may be contact fingers of an edge connector of the PCB. A reference trace is formed on a second surface of the dielectric layer (step 352). The reference trace is positioned between the differential signal traces and may have dimensions that are constrained within outer parameters of the signal traces. Each of the reference trace and differential signal traces comprises a metal.

One or more parameters of the reference trace are adjusted to set the differential impedance of the differential signal traces (step 353). The parameters of the reference trace include the thickness of the reference trace, the width of the reference trace, and the position of the reference trace on the second surface of the dielectric layer. For example, parameters of the differential signal traces and the dielectric layer may be fixed or have limited adjustability because of electrical or mechanical constraints imposed by a standard. In that example, one or more parameters of the reference trace are adjusted to set the differential impedance of the differential signal traces to meet a target impedance required by the standard, while holding parameters of the dielectric layer and the differential signal traces constant.

Embodiments of the present invention have been described above in the context of differential signal traces. In light of the present disclosure, it can be appreciated that the present teachings can also be applied to a single-ended signal trace as now described beginning with FIG. 15.

Figure 15:
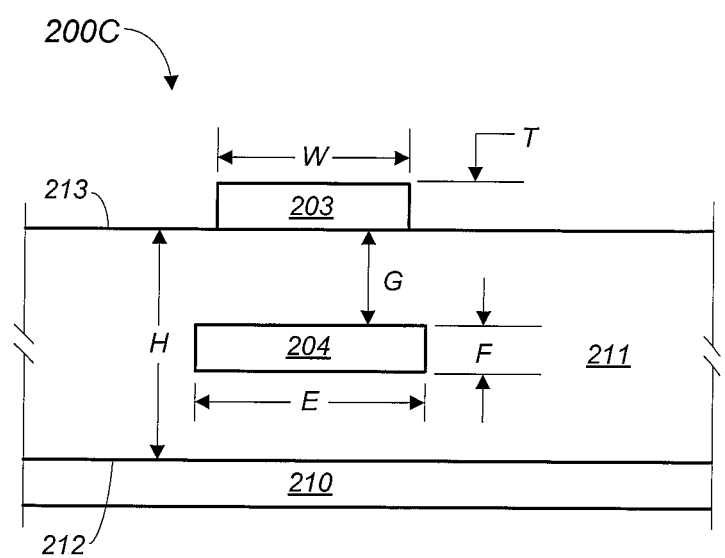
FIG. 15 is a cross-sectional view of a PCB in accordance with an embodiment of the present invention.

FIG. 15 is a cross-sectional view of a PCB 200C in accordance with an embodiment of the present invention. The PCB 200C is a particular embodiment of the PCB 200 shown in FIG. 4.

In the PCB 200C, the reference trace 204 is directly below a single-ended signal trace 203, i.e., a signal trace that is configured to propagate a single-ended signal. The signal trace 203 has a width W and a thickness T. The signal trace 203 is formed on a surface 213 of the dielectric layer 211, which has a thickness H. The reference trace 204 may have a width E that is narrower or wider than the width W of the signal trace 203.

One or more parameters of the reference trace 204 are adjusted to set the impedance of the signal trace 203 to meet a target impedance. For example, given constant/fixed or limited adjustability of the parameters of the signal trace 203, dielectric layer 211, and reference plane 210, the impedance of the signal trace 203 may be set to meet a target impedance by adjusting one or more parameters of the reference trace 204. The parameters of the reference trace 204 include a width E, thickness F, depth G between the reference trace 204 and the signal trace 203, and the position of the reference trace 204 within the dielectric layer 211. A method of setting an impedance of a single-ended signal trace 203 may be the same as the method 300 of FIG. 12, except that the signal trace is single-ended instead of differential.

Figure 16:
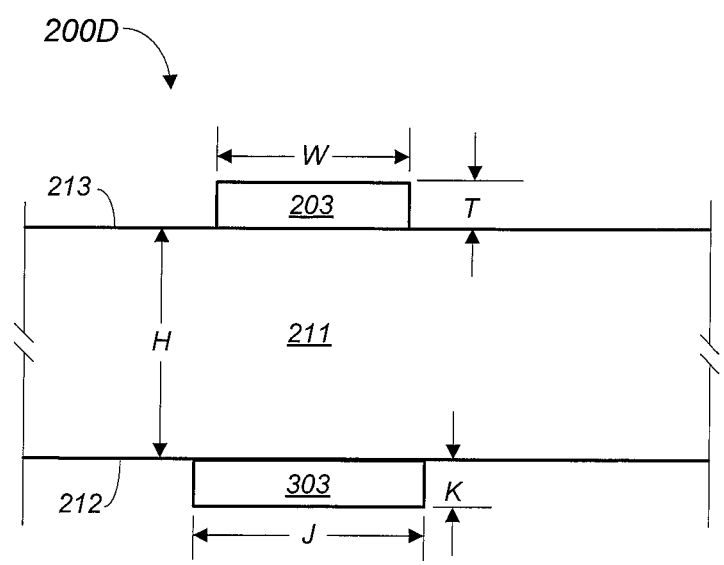
FIG. 16 is a cross-sectional view of a PCB in accordance with an embodiment of the present invention.

FIG. 16 is a cross-sectional view of a PCB 200D in accordance with an embodiment of the present invention. The PCB 200D is a particular embodiment of the PCB 200 shown in FIG. 4. The PCB 200D is the same as the PCB 200 but without a reference trace 204 within the dielectric layer 211, without a reference plane 210 on the opposing surface 212 of the dielectric layer 211, and with a single-ended signal trace 203 instead of differential signal traces. Similar to the PCB 200B of FIG. 13, the PCB 200D includes a reference trace 303 on the surface 212 of the dielectric layer 211.

More particularly, the PCB 200D comprises the dielectric layer 211 and a single-ended signal trace 203. The signal trace 203, which is formed on the surface 213 of the dielectric layer 211, has a width W and a thickness T. The dielectric layer 211 has a thickness H. A reference trace 303, instead of a reference plane, is formed on the surface 212 of the dielectric layer 211. In the example of FIG. 16, the reference trace 303 is directly under the signal trace 203, has a thickness K, and has a width J. The reference trace 303 may have a width J that is narrower or wider than the width W of the signal trace 203. The thickness K, width J, and the position of the reference trace 303 on the surface 212 of the dielectric layer 211 may be adjusted to set the impedance of the signal trace 203. A method of setting an impedance of a single-ended signal trace 203 may be the same as the method 350 of FIG. 14, except that the signal trace is single-ended instead of differential.

Instead of having an edge connector, a circuit board may have an external connector mounted thereon. This allows the circuit board to be connected to other circuit boards and circuits in general using different connectors to meet the requirements of different applications. A reference metal layer may be embedded within the housing of the connector to set the impedance of single-ended or differential metal contacts of the connector. Embodiments pertaining to setting the impedance of differential metal contacts (i.e., impedance presented by the differential metal contacts to a differential signal), are now explained beginning with FIG. 17.

Figure 17:
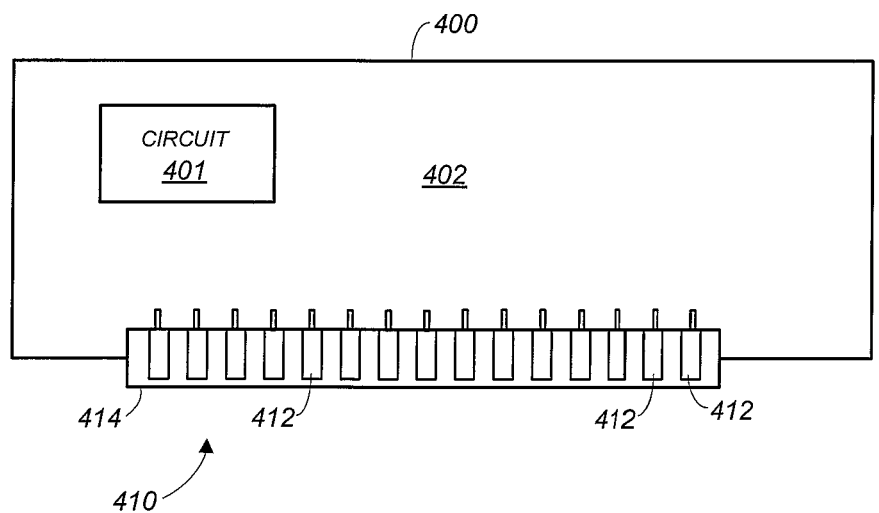
FIG. 17 is a side view of a PCB in accordance with an embodiment of the present invention.

FIG. 17 is a side view of a PCB 400 in accordance with an embodiment of the present invention. The PCB 400 comprises a substrate 402 on which an electrical circuit 401 is mounted. The electrical circuit 401 may comprise a solid state drive (SSD), hard disk drive, central processing unit (CPU), network interface, or other circuit.

A connector 410 comprises a plurality of metal contacts 412 and a housing 414. A metal contact 412 provides an electrically conductive terminal for making an electrical connection. The metal contact 412 is also referred to as a "gold finger" in that it is typically made of gold. In general, the metal contact 412 may comprise gold, copper, or other metal. The housing 414, which comprises an electrical insulator, houses and provides mechanical support to the metal contacts 412.

The connector 410 is an external connector in that, unlike an edge connector, the connector 410 is not an integrated part of the PCB 400. Instead, the connector 410 is attached to the PCB 400. The connector 410 may be attached to the substrate 402 using fasteners (e.g., nut/bolt, screws), slot arrangements, solder, adhesive, or other ways. Accordingly, different types of connectors 410 may be attached to the PCB 400 to meet the requirements of different applications. In one embodiment, the PCB 400 has a Non-Volatile Memory Express (NVMe) circuit 401 and the connector 410 is a U.2/U.3 connector. As can be appreciated, embodiments of the present invention are applicable to other circuits boards and connectors.

In the example of FIG. 17, a reference metal layer 416 (see FIG. 18) is embedded within the housing 414. The reference metal layer 416 allows for setting of the differential impedance of adjacent differential metal contacts 412. The reference metal layer 416 may comprise gold, copper, or other metal.

Figure 18:
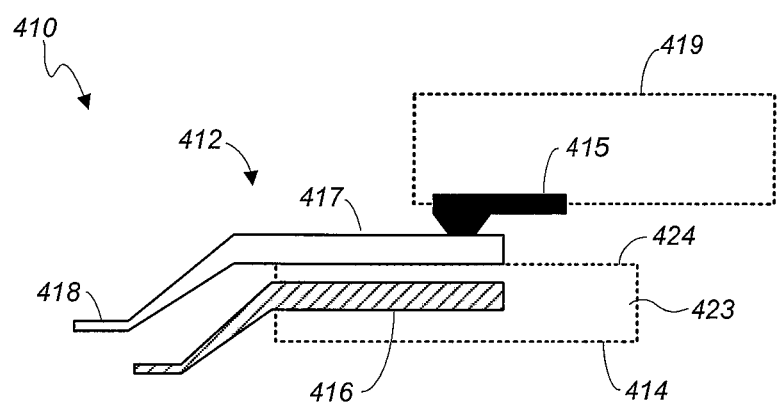
FIG. 18 is a cross-sectional view of a connector in accordance with an embodiment of the present invention.

FIG. 18 is a cross-sectional view of the connector 410 in accordance with an embodiment of the present invention. In one embodiment, a metal contact 412 has a pad portion 417 and a lead portion 418. In the example of FIG. 18, the pad portion 417 is configured to make a removable electrical connection with a contactor 415 (e.g., cantilever beam) of another connector 419. The connector 419 may be mounted on or is a part of another PCB (not shown). The lead portion 418 may be soldered to an electrical node, e.g., ground or a signal trace, on the PCB 400. The reference metal layer 416 is disposed within the housing 414. In one embodiment, the reference metal layer 416 is disposed within a ledge block 423 of the housing 414. The reference metal layer 416 may extend out of the housing 414 to allow for connection to ground. In embodiments where the reference metal layer 416 is left electrically floating, the reference metal layer 416 does not necessarily have to extend out of the housing 414. The metal contacts 412 may be disposed on a top surface 424 of the ledge block 423.

Figure 19:
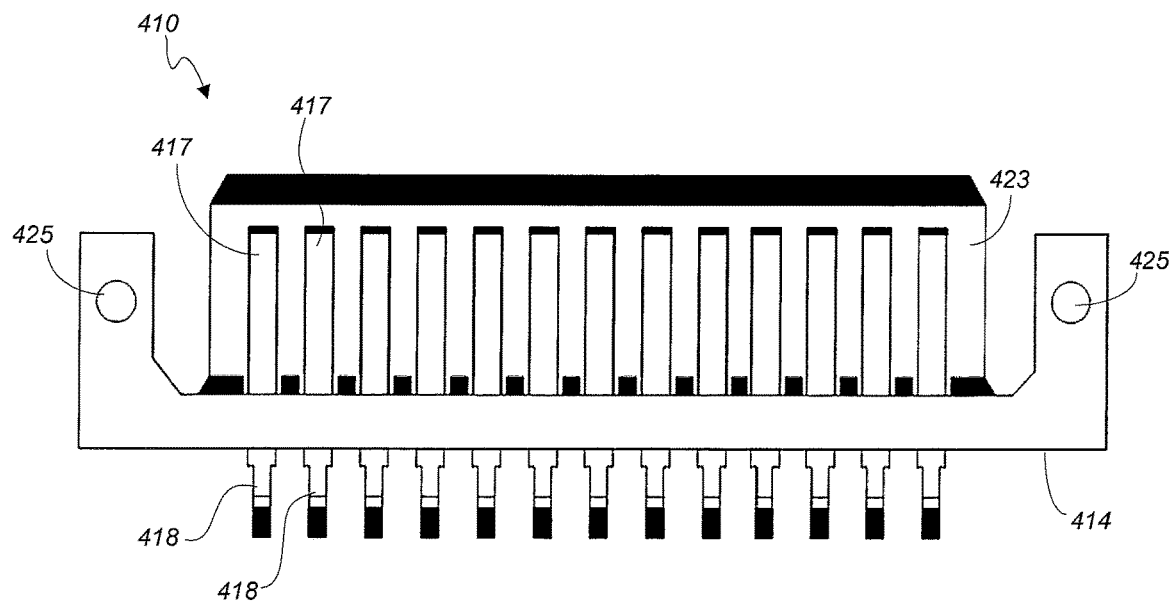
FIGS. 19 and 20 are top views of a connector in accordance with embodiments of the present invention.
Figure 20:
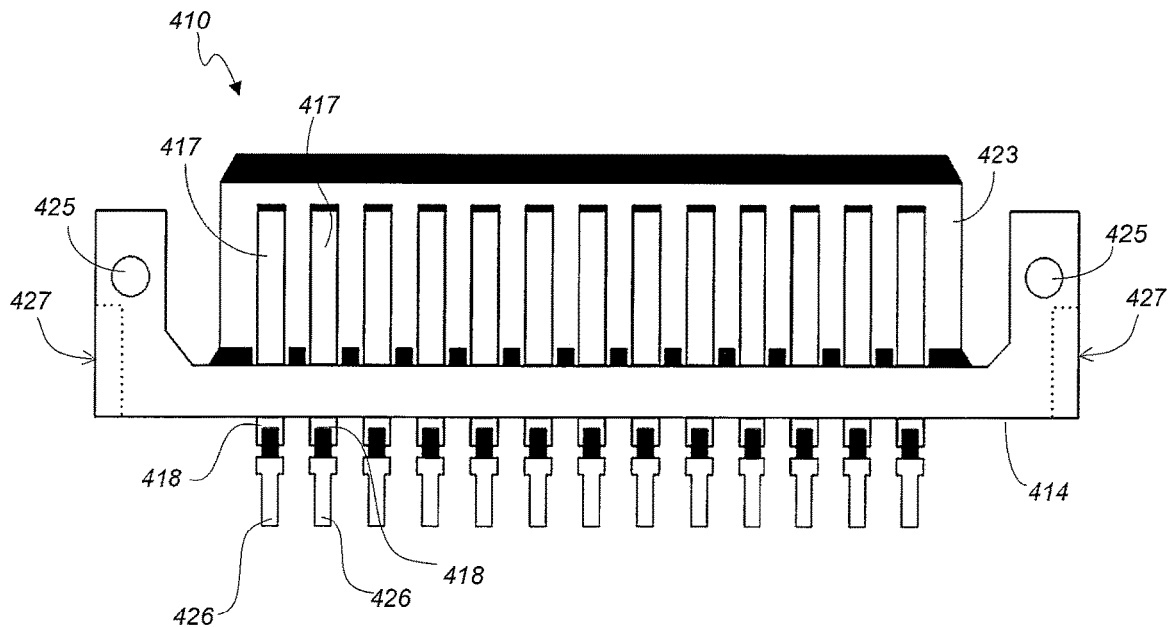

FIGS. 19 and 20 are top views of the connector 410 in accordance with embodiments of the present invention. In one embodiment, the connector 410 includes mounting points that facilitate attachment of the connector 410 onto a circuit board. In the example of FIG. 19, the mounting points include one or more mounting holes 425 for securing the connector 410 to the circuit board using screws, nut and bolt, etc. Also shown in FIG. 19 are the lead portions 418 and pad portions 417 of metal contacts 412. A reference metal layer 416 (not shown) is embedded within the ledge block 423 of the housing 414, under the pad portions 417 of adjacent differential metal contacts 412. The lead portions 418 are soldered to corresponding electrical nodes on the circuit board.

In the example of FIG. 20, the mounting points include side slots 427 (depicted as dotted lines) that accept corresponding edges of the circuit board. The lead portions 418 of the metal contacts 412 are soldered to terminals 426 of the circuit board, which in turn are connected to electrical nodes on the circuit board. A reference metal layer 416 (not shown) is embedded within the ledge block 423 of the housing 414, under the pad portions 417 of adjacent differential metal contacts 412.

Figure 21:
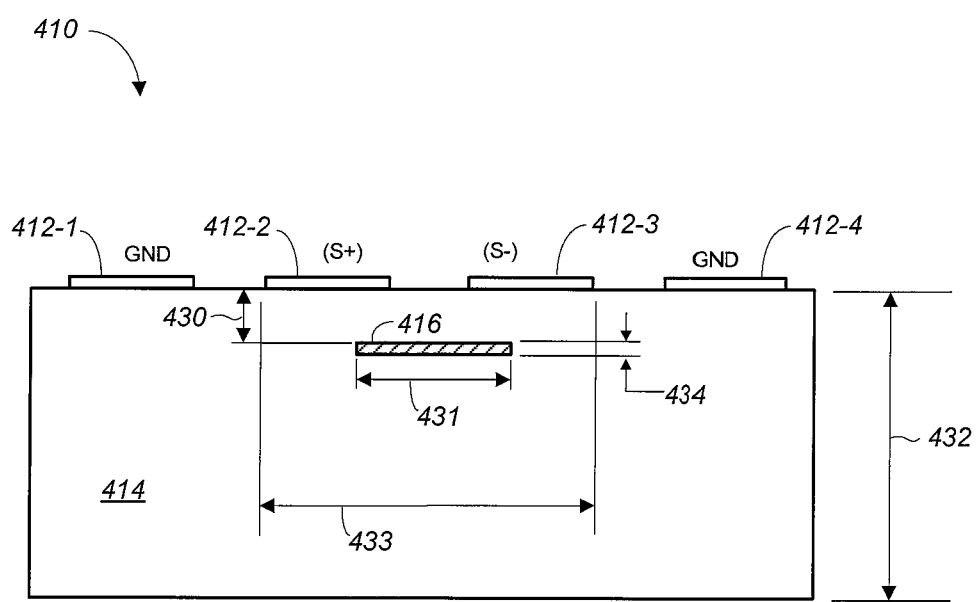
FIG. 21 is a cross-sectional view of a connector in accordance with an embodiment of the present invention.

FIG. 21 is a cross-sectional view of the connector 410 in accordance with an embodiment of the present invention. In one embodiment, the reference metal layer 416 is embedded within the housing 414, under and between adjacent differential metal contacts 412-2 and 412-3 that are configured to carry a differential signal S+/S−. The metal contacts 412-1 and 412-4 that are adjacent to the metal contact 412-2 and 412-3, respectively, are connected to ground reference. The metal contacts 412 (i.e., 412-1, 412-2, etc.) and the reference metal layer 416 may be connected to corresponding electrical nodes on the circuit board.

The reference metal layer 416 may have a width (see dimension 431) that is narrower than a spanning distance between outer side perimeters of the metal contacts 412-2 and 412-3 (see dimension 433). In one embodiment, the ledge block of the housing 414 in which the reference metal layer 416 is embedded has a thickness (see dimension 432) of 48 mil, the reference metal layer 416 is disposed at a depth of (see dimension 430) 7 mil from a top surface of the ledge block of the housing 414, the housing 414 has a dielectric constant of 3.6, and the reference metal layer 416 has a width (see dimension 431) of 38 mil. The width of the reference metal layer 416 may be adjusted to set the impedance of the differential metal contacts 412-2 and 412-3.

The reference metal layer 416 may have a thickness (see dimension 434) of 0.6 mil or 1.2 mil. In general, the thickness of the reference metal layer 416 does not appreciably affect the impedance of metal contacts. The reference metal layer 416 may have a rectangular shape (as viewed from the top) with dimensions of 38 mil×173 mil (width× length). In one embodiment, the metal contacts 412 have a pitch of 13.8 mil and each is 1.7 mil thick. A metal contact 412 may have a rectangular shape (as viewed from the top) with dimensions of 17.7 mil×173 mil (width×length). The metal contacts 412 and the reference metal layer 416 may have parallel substantially rectangular shapes.

Figure 22:
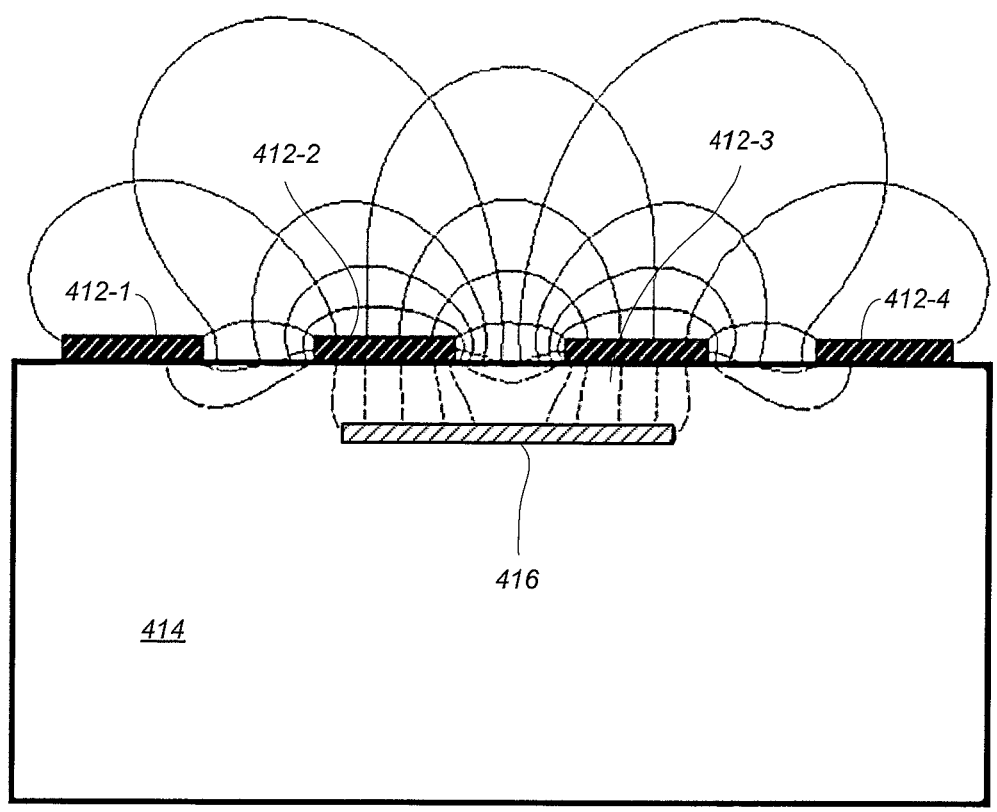
FIG. 22 shows a simulation of electromagnetic field lines generated by a differential signal carried by differential metal contacts of a connector with a reference metal layer in accordance with an embodiment of the present invention.

FIG. 22 shows a simulation of electromagnetic field lines generated by a differential signal carried by the differential metal contacts 412-2 and 412-3. The metal contacts 412-1 and 412-4 are grounded (i.e., connected to ground reference). As illustrated in FIG. 22, the reference metal layer 416 affects the electromagnetic field lines generated by the differential signal. The width of the reference metal layer 416 may be adjusted to set the differential impedance presented by the metal contacts 412-2 and 412-3 to the differential signal. The reference metal layer 416 may be electrically floating or grounded to further tune the differential impedance. The effect of the reference metal layer 416 to the differential impedance may be determined and adjusted by using a suitable electromagnetic field simulation software, such as the ANSYS HFSS software, for example.

Figure 23:
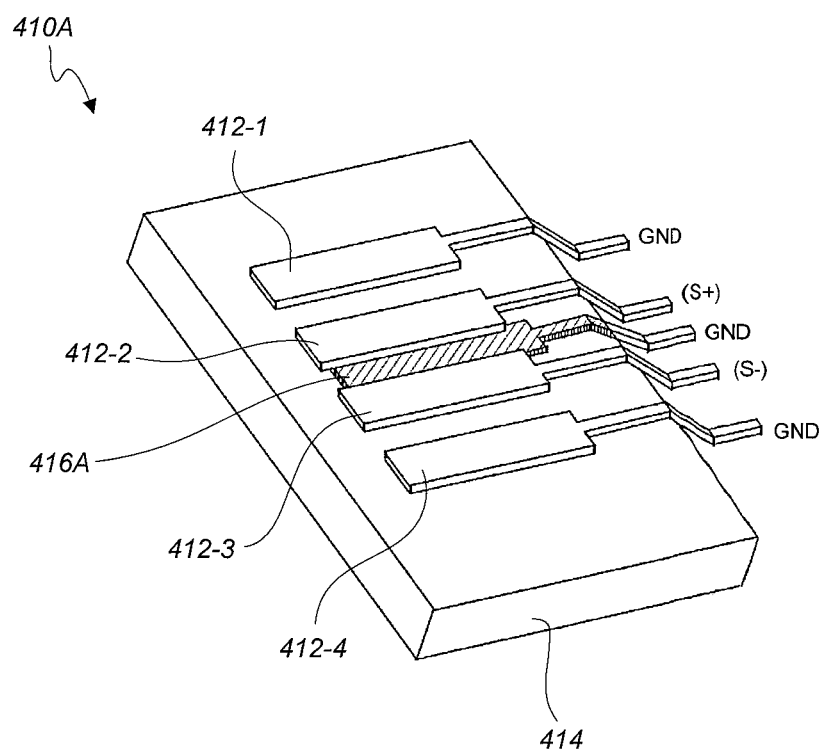
FIG. 23 is a three-dimensional view of a portion a connector with differential metal contacts and a grounded reference metal layer in accordance with an embodiment of the present invention.

FIG. 23 is a three-dimensional view of a portion a connector 410A in accordance with an embodiment of the present invention. The connector 410A is a particular embodiment of the connector 410 wherein the reference metal layer is grounded and sets the differential impedance of differential metal contacts. The reference metal layer may be grounded by connecting it to a ground reference on the circuit board. In the following description, the reference metal layer is relabeled as "416A" to indicate that it is connected to ground reference and sets the differential impedance of differential metal contacts. The housing 414 is depicted as transparent to show the orientation of the reference metal layer 416A relative to the metal contacts 412 (i.e., 412-1, 412-2, etc.). The reference metal layer 416A is embedded within the housing 414, under and between the differential metal contacts 412-2 and 412-3, which are connected to differential signal traces on the circuit board.

Figure 24:
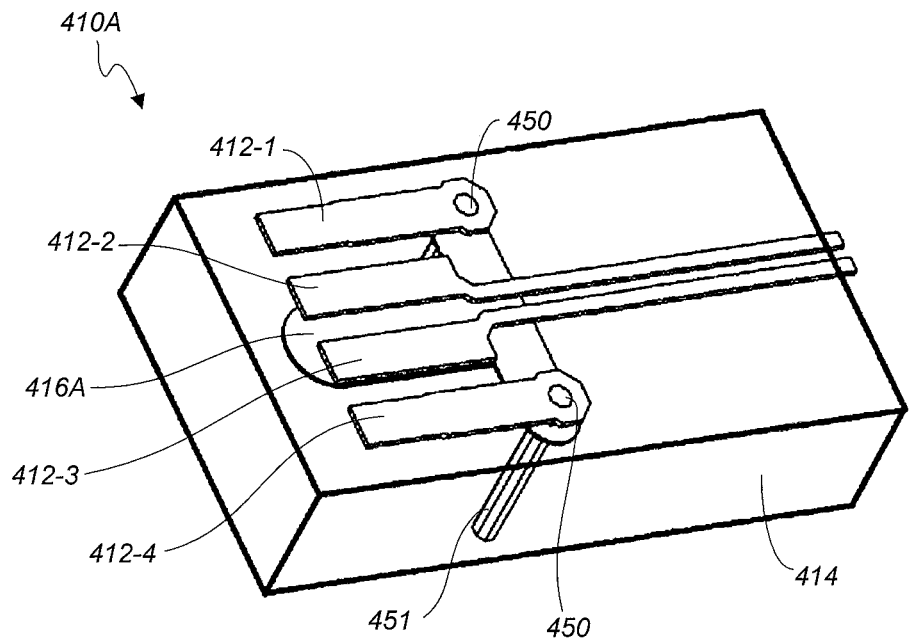
FIGS. 24 and 25 are three-dimensional views of the top side and bottom side, respectively, of the connector of FIG. 23 for simulation modeling purposes in accordance with an embodiment of the present invention.
Figure 25:
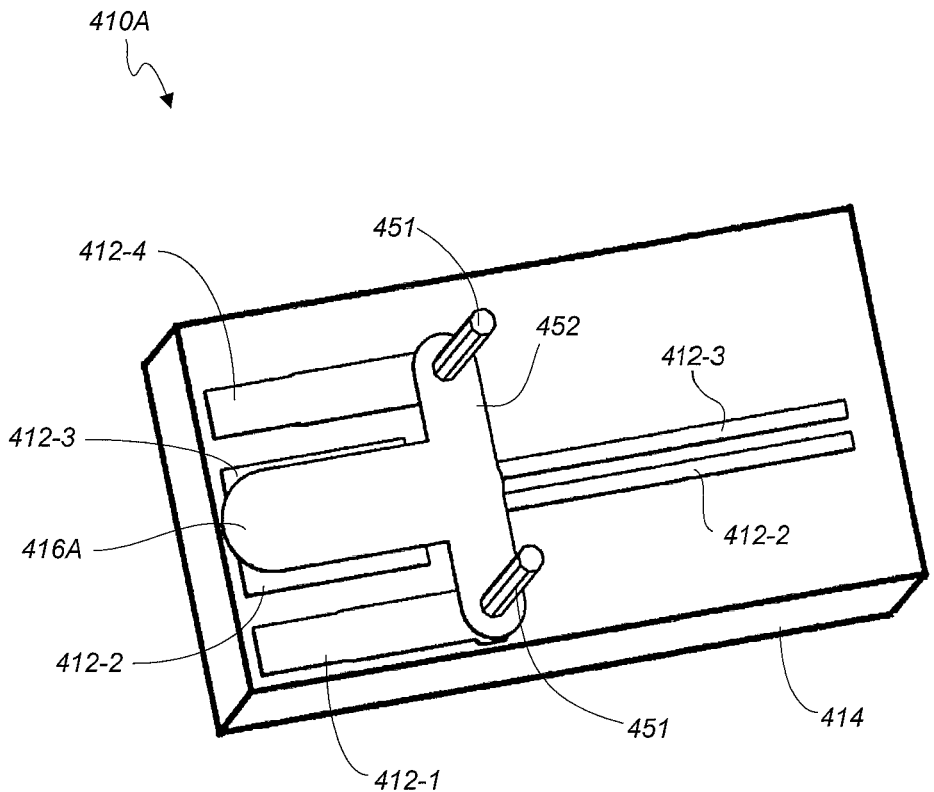

FIGS. 24 and 25 are three-dimensional views of the top side and bottom side, respectively, of the connector 410A for simulation modeling purposes in accordance with an embodiment of the present invention. In one embodiment, metal plugs 451, which go through vias 450, are connected to ground reference. The reference metal layer 416A, metal contact 412-1, and metal contact 412-4 are, in turn, connected to the metal plugs 451. As illustrated in FIG. 25, the reference metal layer 416A may have a T-shape, with a longitudinal portion that is in parallel with the metal contacts 412 and a perpendicular portion (see 452) that is perpendicular to the longitudinal portion.

Figure 26:
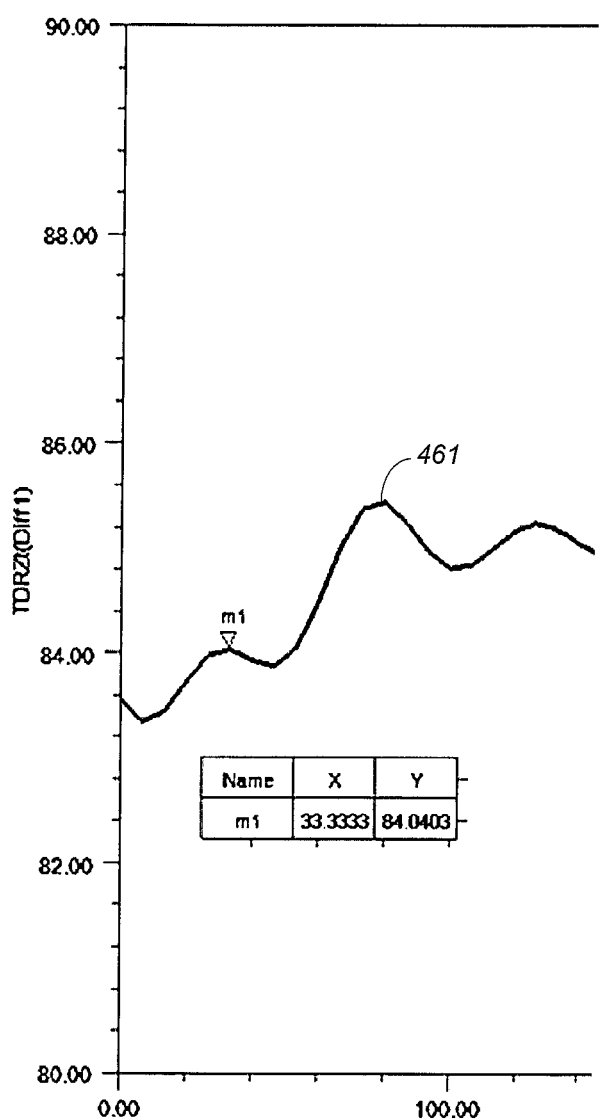
FIG. 26 is a graph of differential impedance of differential metal contacts in the simulation model of FIGS. 24 and 25.

FIG. 26 is a graph 461 of differential impedance of the metal contacts 412-2 and 412-3 in the simulation model of the connector 410A shown in FIGS. 24 and 25. In the simulation model of the connector 410A, the reference metal layer 416A, the metal contacts 412, and the housing 414 have characteristics as described above with reference to FIG. 21. In the example of FIG. 26, the vertical axis indicates differential impedance in Ohms and the horizontal axis indicates time in picoseconds. As shown in FIG. 26, the reference metal layer 416A allows for a differential impedance of about 84 Ohms, which is close to a target impedance of 85 Ohms. The width of the reference metal layer 416A may be adjusted to tune the differential impedance of the differential metal contacts 412-2 and 412-3.

Figure 27:
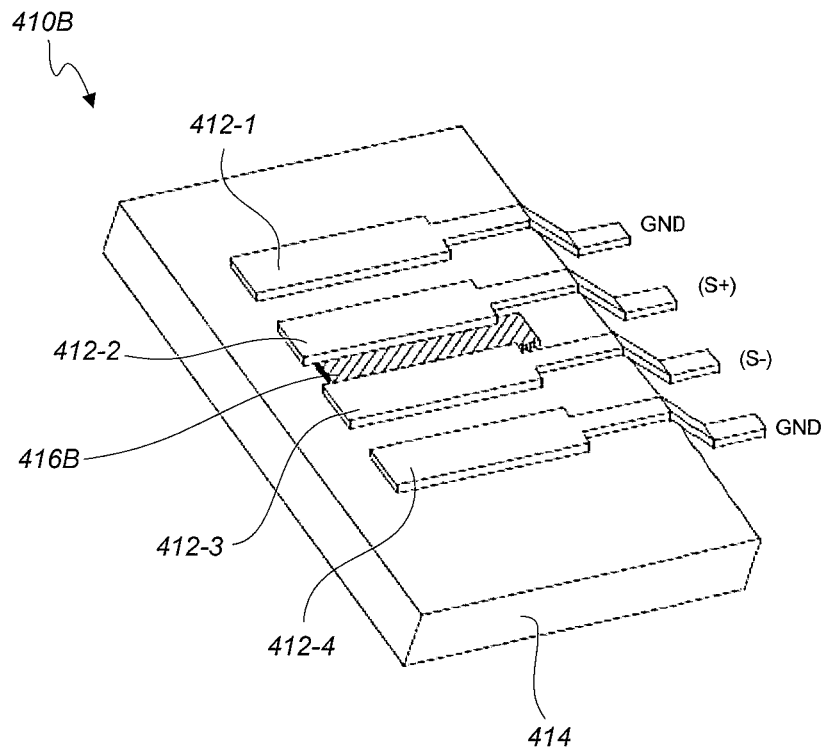
FIG. 27 is a three-dimensional view of a portion a connector that has differential metal contacts and an electrically floating reference metal layer in accordance with an embodiment of the present invention.

FIG. 27 is a three-dimensional view of a portion a connector 410B in accordance with an embodiment of the present invention. The connector 410B is a particular embodiment of the connector 410 wherein the reference metal layer is electrically floating, i.e., not electrically connected to anything. In the following description, the reference metal layer is relabeled as "416B" to indicate that it is electrically floating and sets the differential impedance of differential metal contacts. The housing 414 is depicted as transparent to show the orientation of the reference metal layer 416B relative to the metal contacts 412. The reference metal layer 416B is embedded within the body of the housing 414, under and between the differential metal contacts 412-2 and 412-3, which are connected to differential signal traces on the circuit board.

Figure 28:
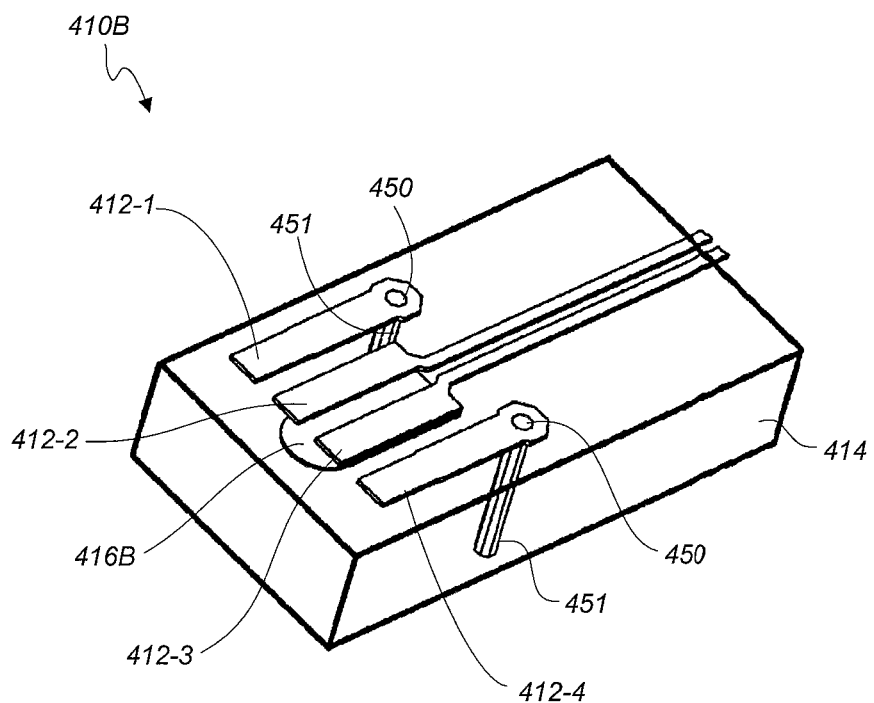
FIGS. 28 and 29 are three-dimensional views of the top side and bottom side, respectively, of the connector of FIG. 27 for simulation modeling purposes in accordance with an embodiment of the present invention.
Figure 29:
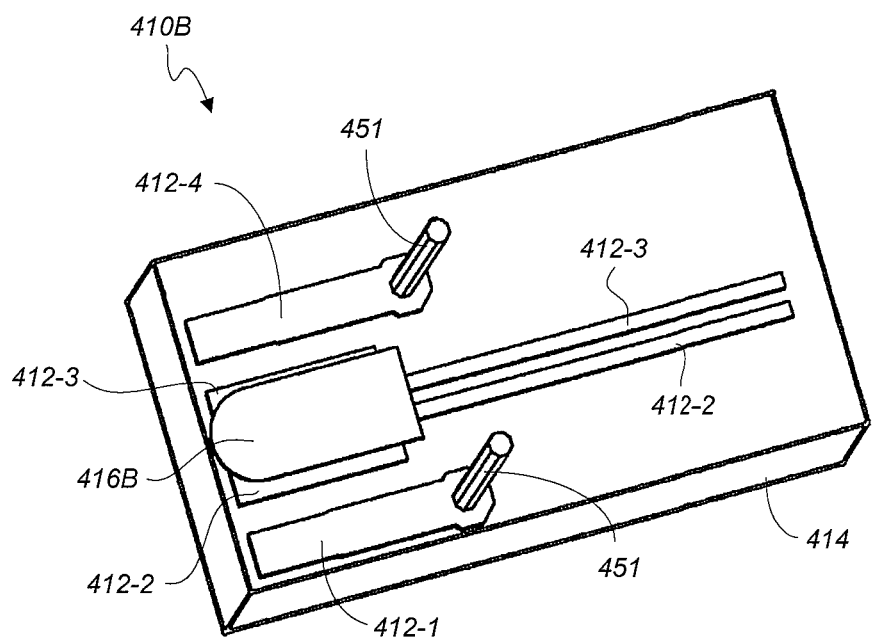

FIGS. 28 and 29 are three-dimensional views of the top side and bottom side, respectively, of the connector 410B for simulation modeling purposes in accordance with an embodiment of the present invention. The metal plugs 451, which go through vias 450, are connected to ground reference. The metal contacts 412-1 and 412-4 are, in turn, connected to the metal plugs 451. As illustrated in FIG. 29, the reference metal layer 416B is electrically floating.

Figure 30:
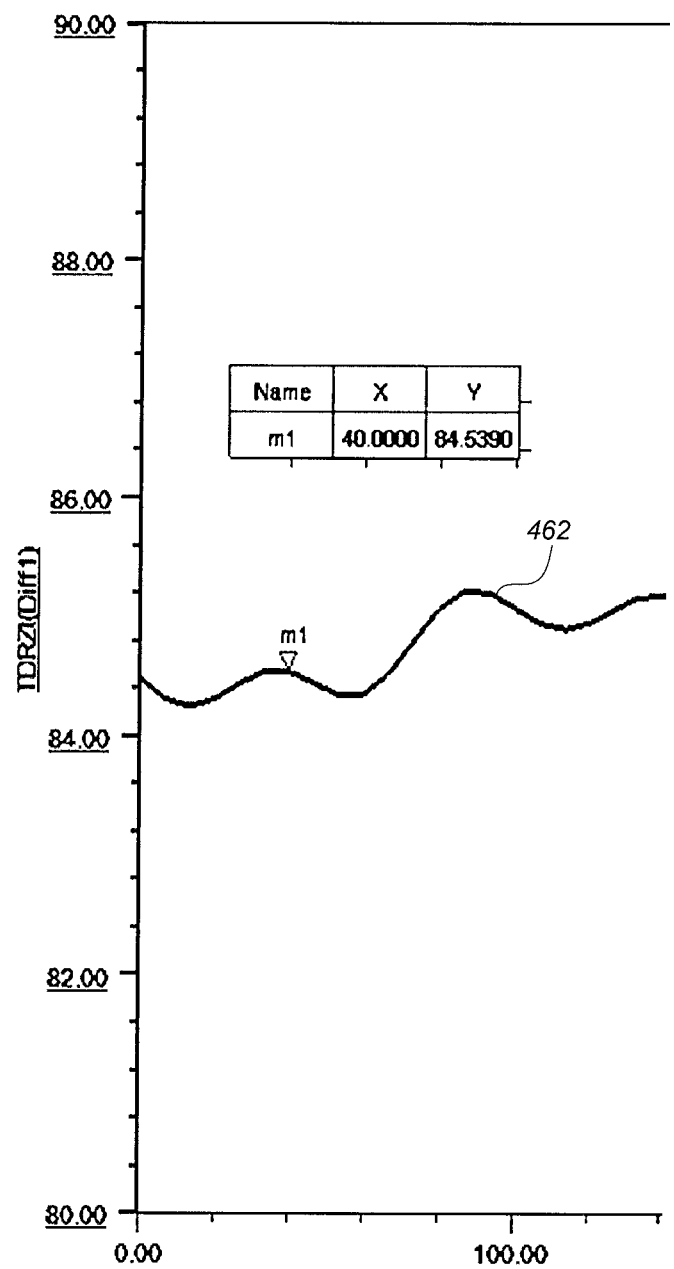
FIG. 30 is a graph of differential impedance of differential metal contacts in the simulation model of FIGS. 28 and 29.

FIG. 30 is a graph 462 of differential impedance of the metal contacts 412-2 and 412-3 in the simulation model of the connector 410B shown in FIGS. 28 and 29. The simulation parameters for the graph 462 are the same as for the graph 461 of FIG. 26 except that the reference metal layer 416B is electrically floating. In the example of FIG. 30, the vertical axis indicates differential impedance in Ohms and the horizontal axis indicates time in picoseconds. As shown in FIG. 30, the reference metal layer 416B allows for a differential impedance of about 84.5 Ohms, which is close to a target impedance of 85 Ohms. The width of the reference metal layer 416B may be adjusted to tune the differential impedance of the differential metal contacts 412-2 and 412-3.

Figure 31:
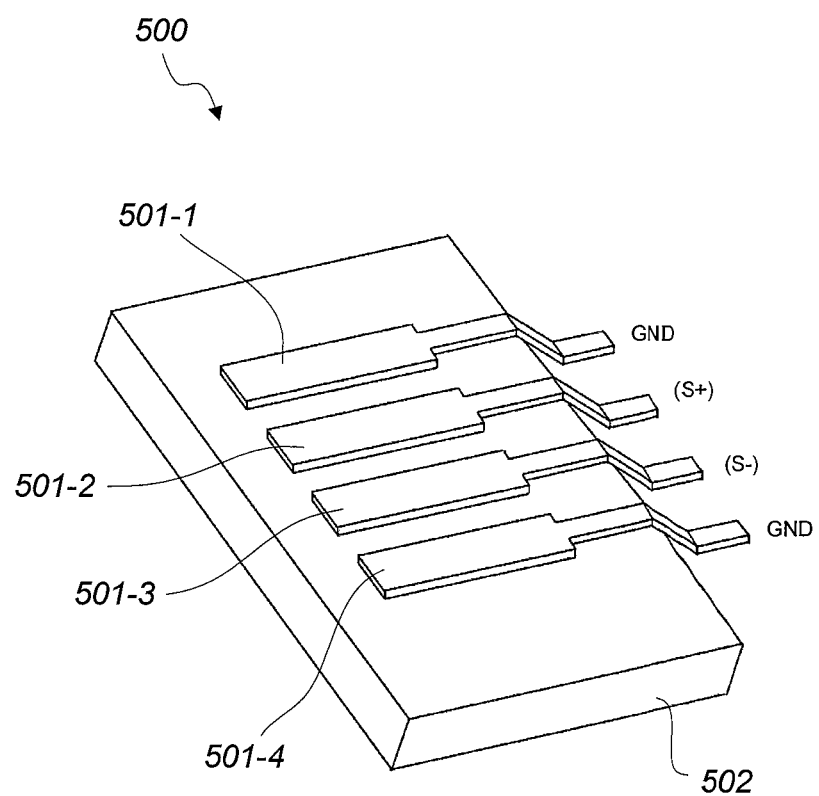
FIG. 31 is a three-dimensional view of a portion of a conventional connector with differential metal contacts.

FIG. 31 is a three-dimensional view of a portion of a conventional connector 500. The connector 500 has a plurality of metal contacts 501 (i.e., 501-1, 501-2, etc.) that are formed on a surface of a housing 502. The metal contacts 501-2 and 501-3 are differential metal contacts that carry a differential signal S+/S−. The metal contacts 501-1 and 501-4 are connected to ground. In contrast to the connector 410, the connector 500 does not have a reference metal layer. This makes it difficult to adjust the differential impedance of the metal contacts 501-2 and 501-3 to meet a target impedance, especially in applications where the pitch and dimensions of the metal contacts 501 are constrained by the application.

Figure 32:
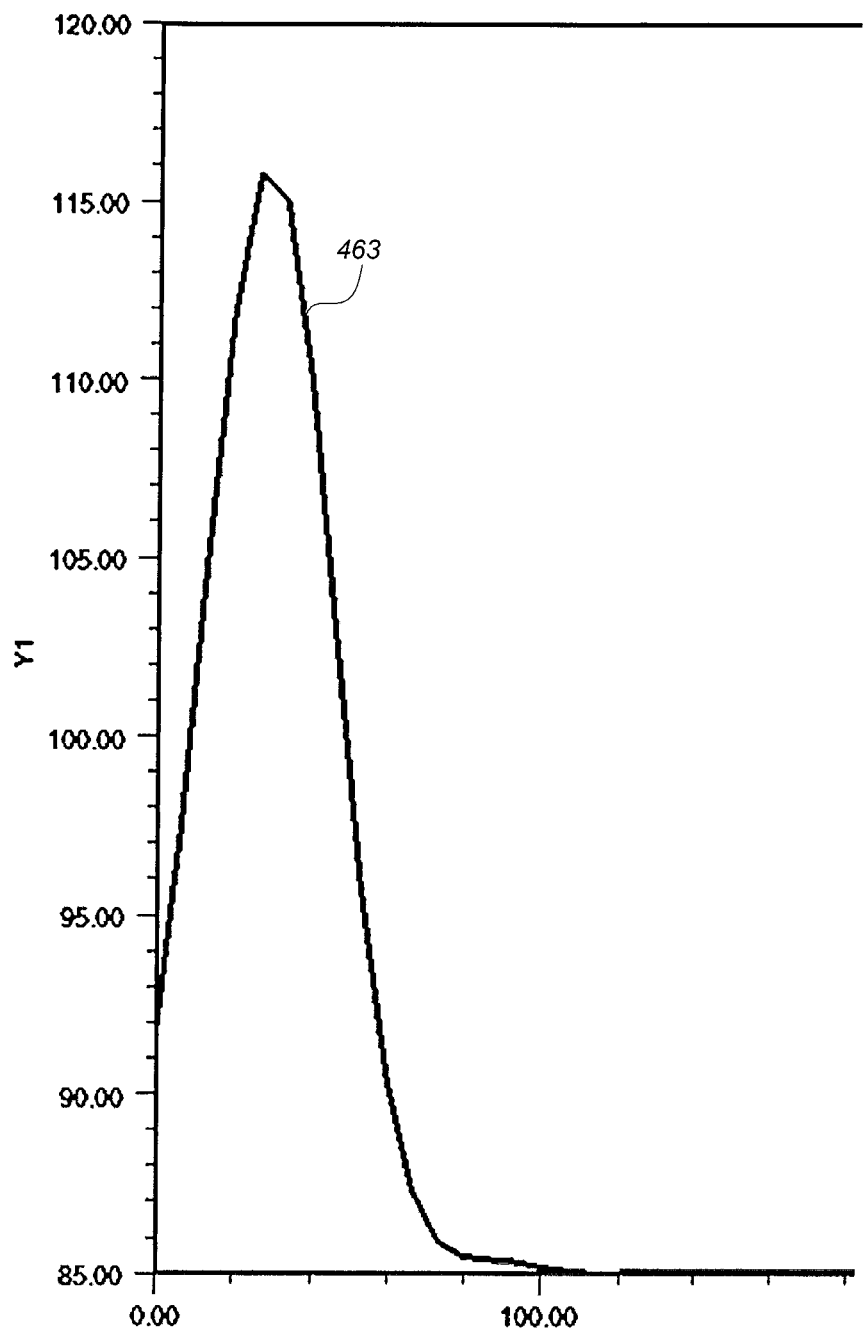
FIG. 32 is a graph of differential impedance of differential metal contacts of the connector of FIG. 31.

FIG. 32 is a graph 463 of differential impedance of the metal contacts 501-2 and 501-3 as determined by simulation that is similar to that performed for the connectors 410A and 410B except without a reference metal layer. In the example of FIG. 32, the vertical axis indicates differential impedance in Ohms and the horizontal axis indicates time in picoseconds. In the example of FIG. 32, the metal contacts 501-2 and 501-3 present a differential impedance of about 115 Ohms, which is relatively high compared to a target impedance of 85 Ohms. Worse, there is no easy way to adjust the differential impedance because the parameters of the metal contacts 501 and housing 502 may be constrained by the application.

Figure 33:
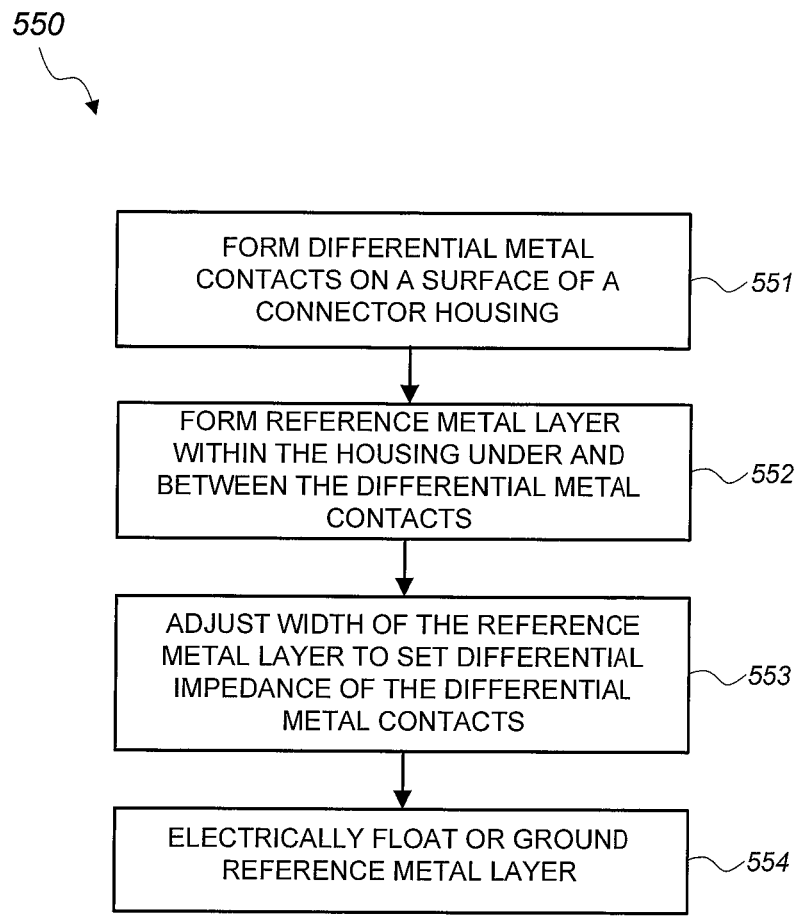
FIG. 33 is a flow diagram of a method of setting a differential impedance of differential metal contacts of a connector in accordance with an embodiment of the present invention.

FIG. 33 is a flow diagram of a method 550 of setting a differential impedance of differential metal contacts of a connector in accordance with an embodiment of the present invention. In the example of FIG. 33, the differential metal contacts are disposed on a surface of a connector housing (step 551). A reference metal layer is formed within the connector housing (step 552), under and between the differential metal contacts. Each of the reference metal layer and differential metal contacts comprises a metal. The reference metal layer may have dimensions that do not extend beyond outer side perimeters of the differential metal contacts. The reference metal layer and the differential metal contacts may have parallel substantially rectangular shapes, with the reference metal layer being narrower than a spanning distance between outer side perimeters of the differential metal contacts. The width of the reference metal layer may be adjusted to set the differential impedance of the differential metal contacts (step 553). The reference metal layer may be electrically floating or connected to ground depending on the application or resulting differential impedance of the differential metal contacts (step 554).

Figure 34:
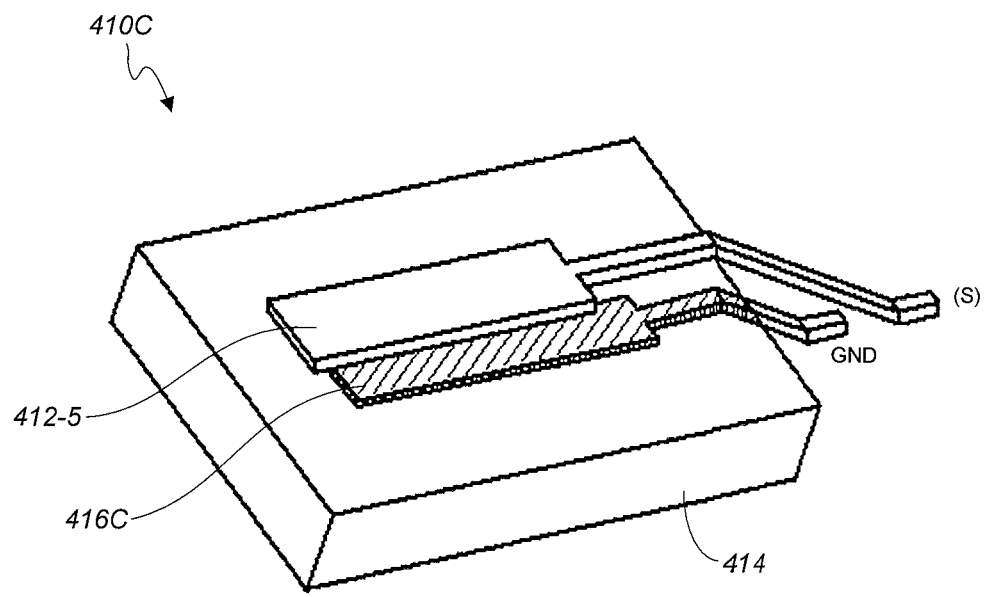
FIG. 34 is a three-dimensional view of a portion of a connector with an orphan single-ended metal contact and a grounded reference metal layer in accordance with an embodiment of the present invention.

A reference metal layer may also be employed to set the impedance of individual single-ended metal contacts of a connector as now described beginning with FIG. 34.

FIG. 34 is a three-dimensional view of a portion a connector 410C in accordance with an embodiment of the present invention. The connector 410C is a particular embodiment of the connector 410 wherein the reference metal layer is grounded and sets the impedance of an orphan single-ended metal contact. A single-ended metal contact is a metal contract that is configured to propagate a single-ended signal. An "orphan" single-ended metal contact is a metal contact with no adjacent metal contact that is connected to ground reference.

In the following description, the reference metal layer is relabeled as "416C" to indicate that it is connected to ground reference and is configured to set the impedance of an orphan single-ended metal contact. More particularly, in the example of FIG. 34, the reference metal layer 416C sets the impedance presented by the single-ended metal contact 412-5 to a single-ended signal. The single-ended metal contact 412-5 is an orphan in that metal the contacts (not shown) that are adjacent to the metal contact 412-5 are not grounded. In the case of an orphan single-ended metal contact, the reference metal layer 416C needs to be connected to ground reference to properly set the impedance of the single-ended metal contact. As before, the housing 414 is depicted as transparent to show the orientation of the reference metal layer 416C relative to the metal contact 412-5. The reference metal layer 416C is embedded within the housing 414, directly under the metal contact 412-5, which is connected to a single-ended signal trace on the circuit board.

Figure 35:
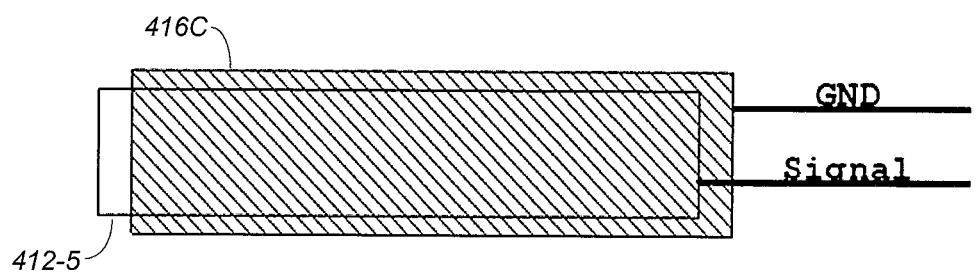
FIG. 35 is a top view of the connector of FIG. 34.

FIG. 35 is a top view of the connector 410C, showing the orientation of the reference metal layer 416C relative to the orphan single-ended metal contact 412-5. In the example of FIG. 35, the reference metal layer 416C is centered directly underneath and is wider than the metal contact 412-5.

Figure 36:
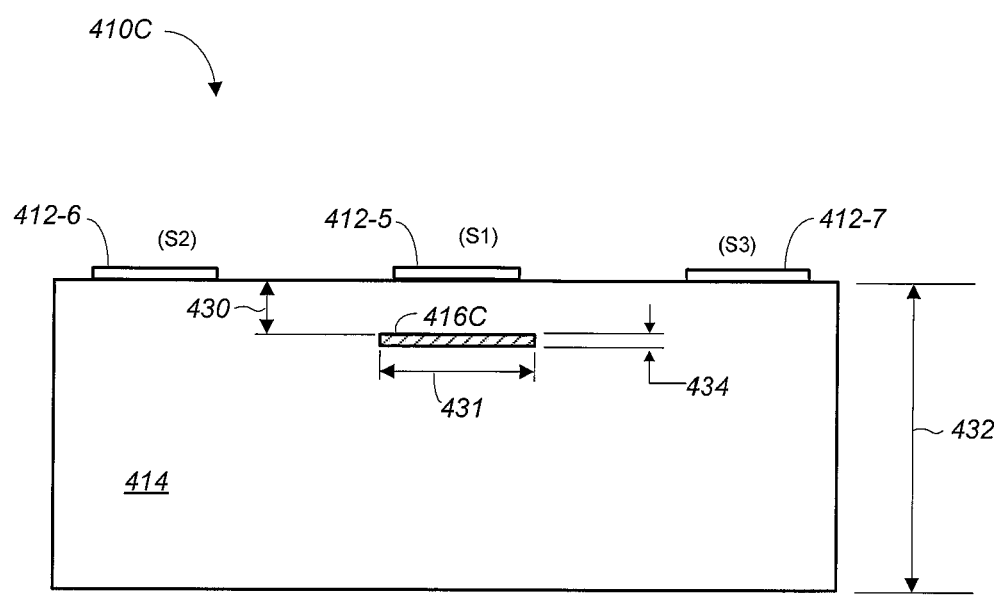
FIG. 36 is a cross-sectional view of a connector with an orphan single-ended metal contact and a grounded reference metal layer in accordance with an embodiment of the present invention.

FIG. 36 is a cross-sectional view of the connector 4100 in accordance with an embodiment of the present invention. In one embodiment, the reference metal layer 416C is embedded within the housing 414, directly under the metal contact 412-5, which is configured to carry a single-ended signal S1. The metal contacts 412-6 and 412-7 that are adjacent to the metal contact 412-5 are not grounded, rendering the metal contact 412-5 to be orphan. In the example of FIG. 36, the metal contacts 412-6 and 412-7 are configured to carry single-ended signals S2 and S3, respectively. The metal contacts 412-5, 412-6, and 412-7 are connected to corresponding single-ended signal traces on the circuit board, whereas the reference metal layer 416C is connected to a ground reference on the circuit board. The width of the reference metal layer 416C may be adjusted to set the impedance of the orphan single-ended metal contact 412-5. The metal contacts, reference metal layer, and connector housing of FIG. 36 may have the same dimensions as in FIG. 21.

Figure 37:
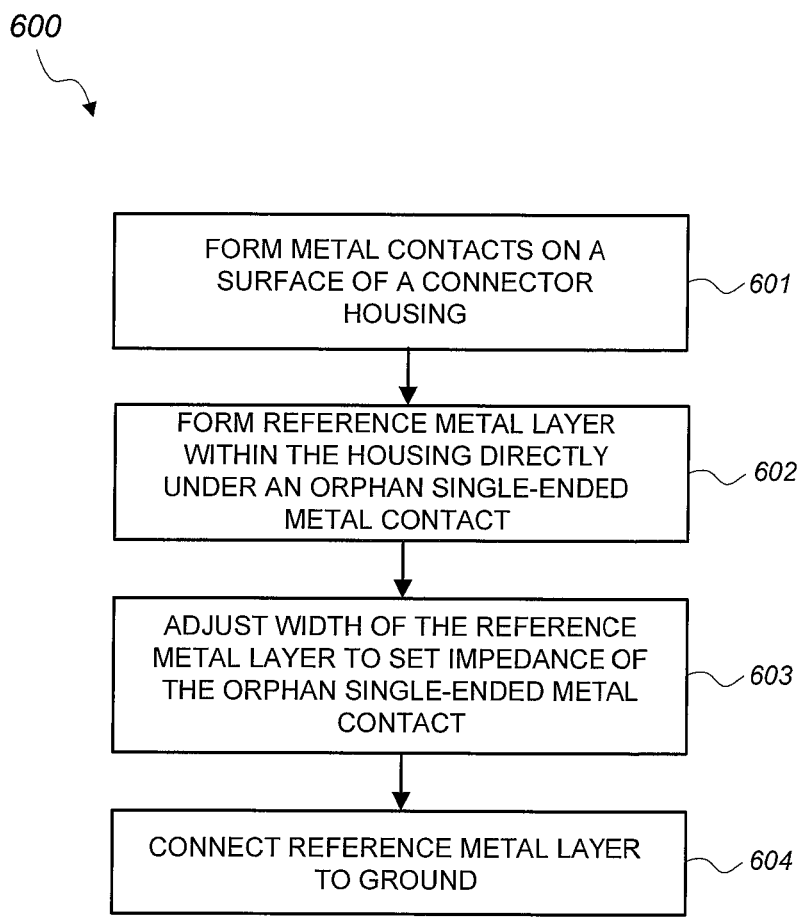
FIG. 37 is a flow diagram of a method of setting an impedance of an orphan single-ended metal contact of a connector in accordance with an embodiment of the present invention.

FIG. 37 is a flow diagram of a method 600 of setting an impedance of an orphan single-ended metal contact of a connector in accordance with an embodiment of the present invention. In the example of FIG. 37, metal contacts are formed on a surface of a connector housing (step 601). A reference metal layer is formed within the connector housing (step 602), directly under an orphan single-ended metal contact. Each of the reference metal layer and single-ended metal contacts comprises a metal. Metal contacts that are adjacent on either side of the orphan single-ended metal contact are not connected to ground reference. The reference metal layer and the orphan single-ended metal contact may have parallel substantially rectangular shapes, with the reference metal layer being wider than the orphan single-ended metal contact. The width of the reference metal layer may be adjusted to set the impedance of the orphan single-ended metal contact (step 603). The reference metal layer is connected to ground reference (step 604).

Figure 38:
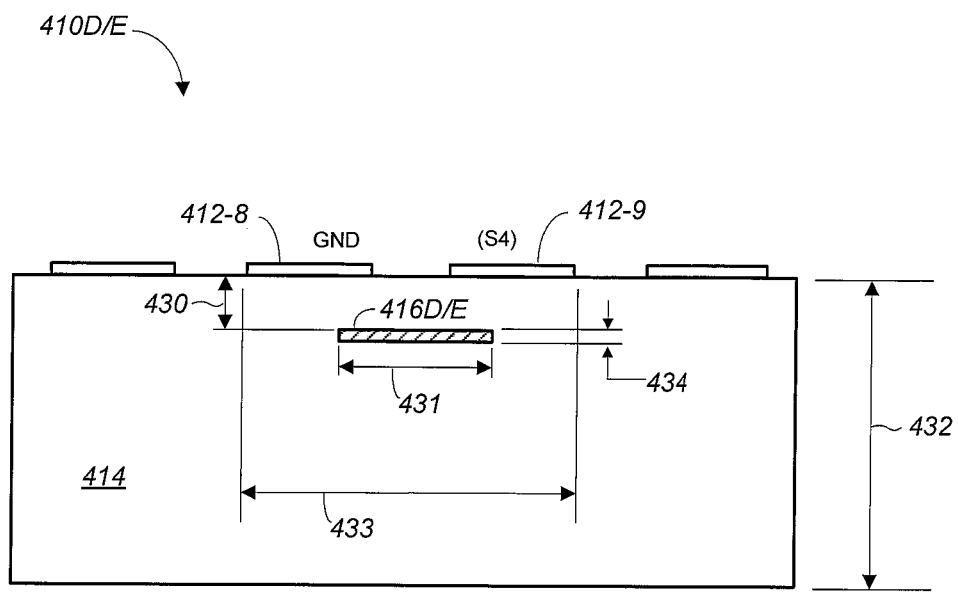
FIG. 38 is a cross-sectional view of a connector with a single-ended metal contact, an adjacent grounded metal contact, and a reference metal layer in accordance with an embodiment of the present invention.

FIG. 38 is a cross-sectional view of a connector 410D/E in accordance with an embodiment of the present invention. In the connector 410D/E, a reference metal layer is employed to set the impedance of a single-ended metal contact that is adjacent to a grounded metal contact. The grounded metal contact may be on either side of the single-ended metal contact.

More particularly, in the example of FIG. 38, the reference metal layer 416D/E is embedded within the housing 414, under a single-ended metal contact 412-9, which is configured to carry a single-ended signal S4. The reference metal layer 416D/E may be grounded (labeled herein as "416D") or left electrically floating (labeled herein as "416E"). The metal contact 412-9 is adjacent to a metal contact 412-8, which is connected to ground reference. The width of the reference metal layer 416D/E (see dimension 431) and/or the location of the reference metal layer 416D/E within the spanning distance 433 between outer side perimeters of the single-ended metal contact 412-9 and grounded metal contact 412-8 may be adjusted to set the impedance of the metal contact 412-9. The metal contact 412-9 is connected to a corresponding single-ended signal trace on the circuit board, whereas the metal contact 412-8 is connected to a ground reference on the circuit board. The reference metal layer 416D/E may or may not be grounded depending on the embodiment. The metal contacts, reference metal layer, and housing of FIG. 38 may have the same dimensions as in FIG. 21.

Figure 39:
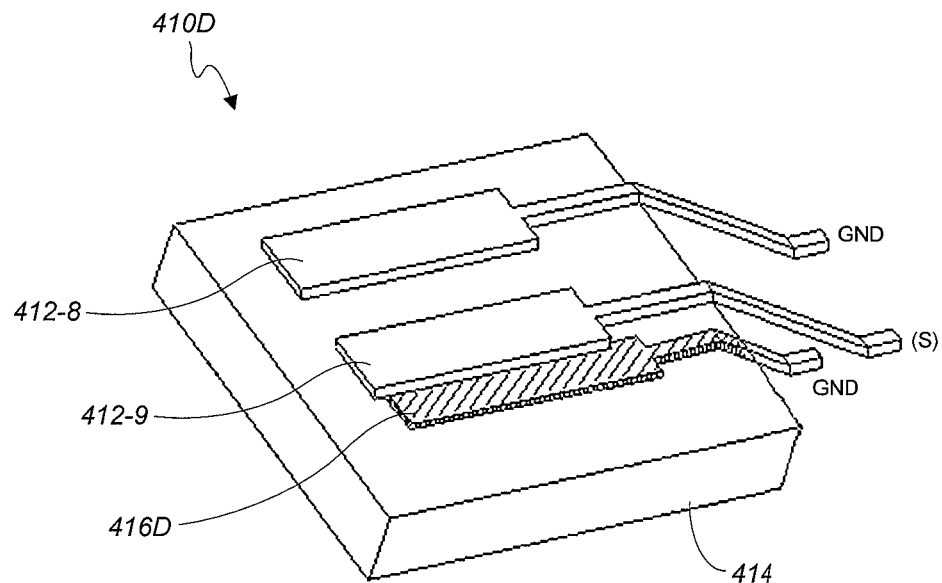
FIG. 39 is a three-dimensional view of a portion a connector with a single-ended metal contact, an adjacent grounded metal contact, and a grounded reference metal layer in accordance with an embodiment of the present invention.

FIG. 39 is a three-dimensional view of a portion a connector 410D in accordance with an embodiment of the present invention. The connector 410D is a particular embodiment of the connector 410 wherein the reference metal layer is grounded and sets the impedance of a single-ended metal contact that is adjacent to a grounded metal contact. The reference metal layer may be grounded by connecting it to a ground reference on the circuit board. In the following description, the reference metal layer is relabeled as "416D" to indicate that it is connected to ground reference and is configured to set the impedance of a single-ended metal contact that is adjacent to a grounded metal contact. More particularly, in the example of FIG. 39, the reference metal layer 416D sets the impedance presented by the single-ended metal contact 412-9 to a single-ended signal. The single-ended metal contact 412-9 is adjacent to a grounded metal contact 412-8. A grounded metal contact may be on either or both sides of the single-ended metal contact 412-9. The housing 414 is depicted as transparent to show the orientation of the reference metal layer 416D relative to the metal contacts 412-8 and 412-9. In the example of FIG. 39, the reference metal layer 416D is embedded within the housing 414, directly under the metal contact 412-9, which is connected to a single-ended signal trace on the circuit board.

Figure 40:
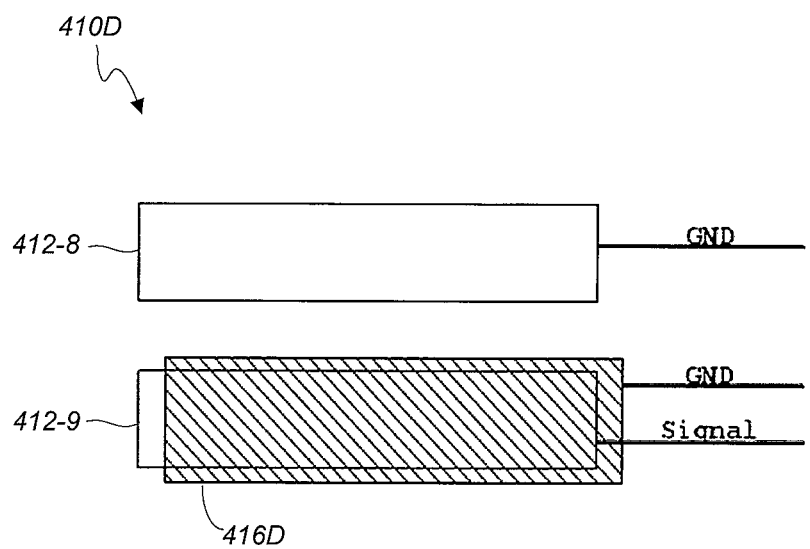
FIG. 40 is a top view of the connector of FIG. 39.

FIG. 40 is a top view of the connector 410D, showing the orientation of the reference metal layer 416D relative to the metal contacts 412-8 and 412-9. In the example of FIG. 40, the reference metal layer 416D is centered directly underneath and is wider than the metal contact 412-9. The width of the reference metal layer 416D may be adjusted to set the impedance presented by the metal contact 412-9 to a single-ended signal.

Figure 41:
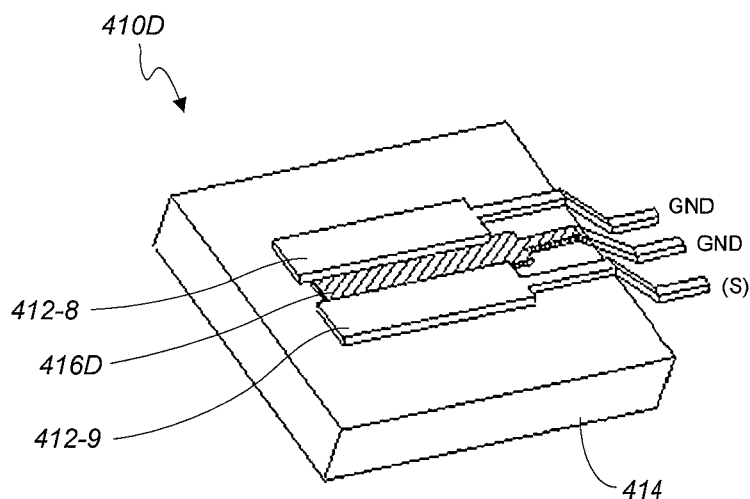
FIG. 41 is a three-dimensional view of a portion a connector with a single-ended metal contact, an adjacent grounded metal contact, and a grounded reference metal layer in accordance with another embodiment of the present invention.

The impedance of the metal contact 412-9 may also be set by adjusting the location of the reference metal layer 416D between outer side perimeters of the metal contact 412-9 and the adjacent grounded metal contact, which is the metal contact 412-8 in this example. This is illustrated in FIG. 41, which is a three-dimensional view of a portion a connector 410D in accordance with an embodiment of the present invention. In the example of FIG. 41, the reference metal layer 416D is embedded within the housing 414, under and between the single-ended metal contact 412-9 and the grounded metal contact 412-8.

Figure 42:
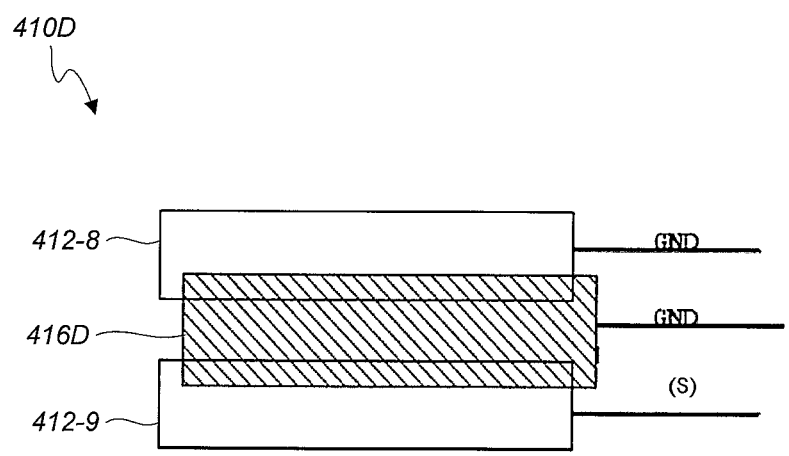
FIG. 42 is a top view of the connector of FIG. 41.

FIG. 42 is a top view of the connector 410D of FIG. 41, showing the orientation of the reference metal layer 416D relative to the single-ended metal contact 412-9 and the grounded metal contact 412-8. In the example of FIG. 42, the reference metal layer 416D is centered between the metal contacts 412-8 and 412-9. In general, the reference metal layer 416D may be located within a spanning distance between outer side perimeters of the metal contacts 412-8 and 412-9 to set the impedance of the metal contact 412-9. Alternatively or in addition, the width of the reference metal layer 416D may be adjusted to set the impedance of the metal contact 412-9.

Figure 43:
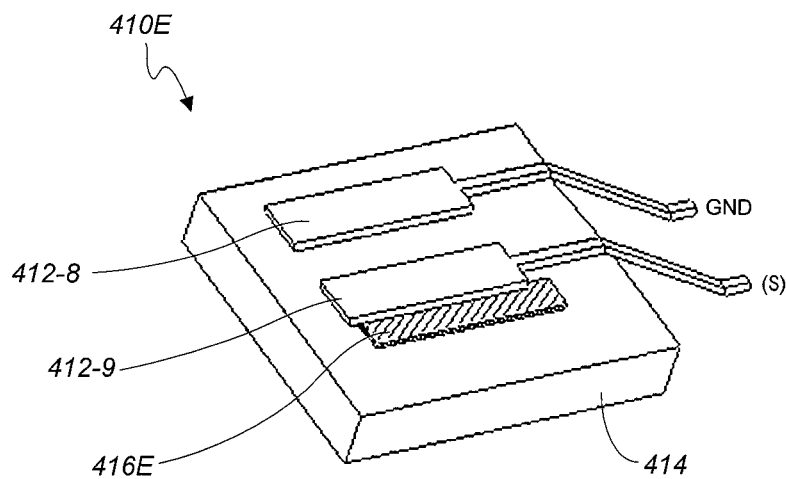
FIGS. 43 and 44 are three-dimensional views of a portion a connector with a single-ended metal contact, an adjacent grounded metal contact, and a reference metal layer that is not connected to ground in accordance with embodiments of the present invention.
Figure 44:
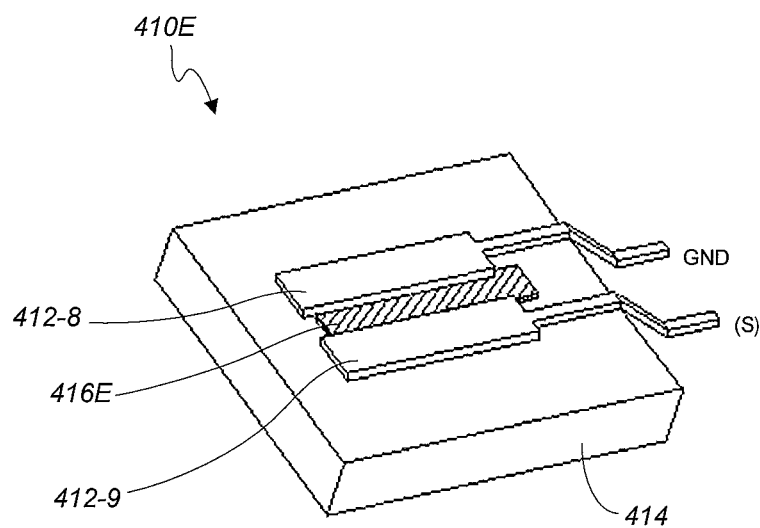

FIGS. 43 and 44 are three-dimensional views of a portion a connector 410E in accordance with an embodiment of the present invention. The connector 410E is the same as the connector 410D of FIGS. 39 and 41 except that the reference metal layer, which is relabeled as "416E", is electrically floating. FIG. 43 shows the reference metal layer 416E as being centered directly underneath the single-ended metal contact 412-9, while FIG. 44 shows the reference metal layer 416E as being centered between the single-ended metal contact 412-9 and grounded metal contact 412-8. In general, the reference metal layer 416E may be located within a spanning distance between the single-ended metal contact 412-9 and the grounded metal contact 412-8 to set the impedance of the single-ended metal contact 412-9. Alternatively or in addition, the width of the reference metal layer 416E may be adjusted to set the impedance of the single-ended metal contact 412-9.

Figure 45:
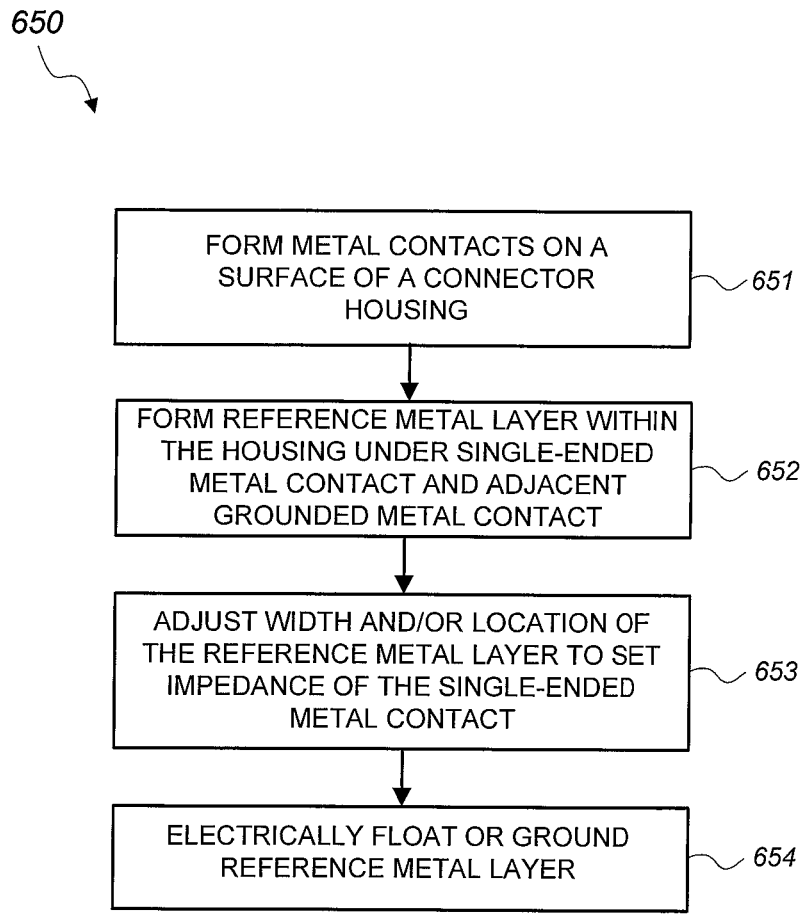
FIG. 45 is a flow diagram of a method of setting an impedance of a single-ended metal contact that has an adjacent grounded metal contact of a connector in accordance with an embodiment of the present invention.

FIG. 45 is a flow diagram of a method 650 of setting an impedance of a single-ended metal contact that has an adjacent grounded metal contact of a connector in accordance with an embodiment of the present invention. In the example of FIG. 45, metal contacts are formed on a surface of a connector housing (step 651). A reference metal layer is formed within the body of the connector housing, under a single-ended metal contact and a grounded metal contact that is adjacent to the single-ended metal contact (step 652). The reference metal layer may be located within a spanning distance between outer side perimeters of the single-ended metal contact and the grounded metal contact to set the impedance of the single-ended metal contact (step 653). Alternatively or in addition, the width of the reference metal layer may be adjusted to set the impedance of the single-ended metal contact (step 653). The reference metal layer may be grounded or left electrically floating (step 654).

Circuit boards, connectors, and methods of setting an impedance of signal traces and metal contacts have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A circuit board comprising:
a substrate; and
a connector that is attached to the substrate, the connector comprising a housing, a reference metal layer that is embedded within the housing, and a plurality of metal contacts,
wherein adjacent first and second metal contacts of the plurality of metal contacts are configured to carry a differential signal and are connected to corresponding differential signal traces on the circuit board, the reference metal layer is under and between the first and second metal contacts, and the reference metal layer is configured to set a differential impedance of the first and second metal contacts,
wherein the reference metal layer is electrically floating.

2. The circuit board of claim 1, wherein each of the plurality of metal contacts has a pad portion and a lead portion, the pad portion being configured to make a removable electrical connection with a contactor of another connector of another circuit board, and the lead portion is connected to an electrical node on the circuit board.

3. The circuit board of claim 1, further comprising an electrical circuit that is mounted on the circuit board.

4. The circuit board claim 2, wherein the electrical circuit comprises solid-state memory.

5. The circuit board of claim 1, wherein the reference metal layer is narrower than a spanning distance between outer side perimeters of the first and second metal contacts.

* * * * *